United States Patent
Uchiyama

(10) Patent No.: US 8,742,482 B2
(45) Date of Patent: Jun. 3, 2014

(54) SEMICONDUCTOR DEVICE HAVING CELL CAPACITORS

(76) Inventor: Hiroyuki Uchiyama, Tokyo (JP)

(*) Notice: Subject to any disclaimer, the term of this patent is extended or adjusted under 35 U.S.C. 154(b) by 136 days.

(21) Appl. No.: 13/408,165

(22) Filed: Feb. 29, 2012

(65) Prior Publication Data

US 2012/0241830 A1    Sep. 27, 2012

(30) Foreign Application Priority Data

Mar. 25, 2011 (JP) ................... 2011-067054

(51) Int. Cl.
*H01L 27/108* (2006.01)

(52) U.S. Cl.
USPC ........... 257/296; 257/298; 257/300; 257/306; 257/308; 257/309; 257/311; 257/E27.084

(58) Field of Classification Search
CPC ............... H01L 27/10817; H01L 27/10852; H01L 27/10855; H01L 28/91
USPC .......... 257/296, 298, 300, 306, 308, 309, 311
See application file for complete search history.

(56) References Cited

U.S. PATENT DOCUMENTS

| | | | |
|---|---|---|---|
| 6,914,286 B2 | 7/2005 | Park | |
| 2004/0000684 A1 | 1/2004 | Park | |
| 2010/0187588 A1* | 7/2010 | Kim et al. | 257/306 |

FOREIGN PATENT DOCUMENTS

JP    2004-031950    1/2004

* cited by examiner

*Primary Examiner* — Matthew W Such
*Assistant Examiner* — David Spalla
(74) *Attorney, Agent, or Firm* — Young & Thompson

(57) ABSTRACT

A semiconductor device including: a bit line being arranged on top surfaces of first and second contact plugs via a first insulation layer and extending in a direction connecting a first impurity diffusion layer and a second impurity diffusion layer; a bit line contact plug being formed through the first insulation layer and electrically connecting the bit line to the first contact plug; a first cell capacitor having a first lower electrode beside one of side surfaces of the bit line; a first insulation film insulating the bit line and the first lower electrode from each other; and a first contact conductor electrically connecting a bottom end of the first lower electrode to a side surface of the second contact plug.

9 Claims, 23 Drawing Sheets

SEMICONDUCTOR DEVICE HAVING CELL CAPACITORS

BACKGROUND OF THE INVENTION

1. Field of the Invention

The present invention relates to a semiconductor device and a method of manufacturing the same. In particular, the present invention relates to a semiconductor device having cell capacitors and a method of manufacturing the same.

2. Description of Related Art

Some recent model dynamic random access memories (DRAMs) use stacked capacitor type memory cells in which cell capacitors are formed above cell transistors. As compared to planar type memory cells, stacked capacitor type memory cells are characterized in that cell capacitors of high capacity can be formed in a small area.

Stacked capacitor type memory cells typically have cell capacitors of crown-shaped structure. A cell capacitor having such a structure includes a closed-bottomed cylindrical lower electrode, a capacitor insulation film that covers side and top surfaces of the lower electrode, and an upper electrode that covers the lower electrode via the capacitor insulation film. The lower electrode is connected to an underlying cell transistor by a capacitor contact plug which extends vertically.

Japanese Patent Application Laid-open No. 2004-31950 discloses a technique by which the lower electrodes of cell capacitors in stacked capacitor type memory cells can be formed in a fine line width. According to the technique, insulator sidewalls and conductor sidewalls are alternately formed to achieve the formation of lower electrodes in a fine line width.

There are several types of cell transistors. If planar cell transistors are applied to the stacked capacitor type memory cells, it is needed to devise the layout of bit lines etc. That is, planar cell transistors have two electrodes to be controlled, one connected with a capacitor contact plug and the other connected with a bit line contact plug. Since such electrodes to be controlled are arranged next to one another in the direction of bit lines, some contrivance is needed to avoid collision between capacitor contact plugs and bit lines. Specific measures that have been taken include: forming bit lines in a wavy wiring pattern; arranging cell transistors obliquely to bit lines; and forming bit lines in areas between cell transistors and arranging bit line contact plugs across boundaries between the bit lines and the cell transistors when seen in a plan view.

It is preferred, however, that bit lines be straight in shape, the longitudinal direction of cell transistors be parallel to the direction of bit lines, and bit lines be laid in positions overlapping cell transistors when seen in a plan view. A technology that allows such configuration is thus desired.

SUMMARY

In one embodiment, there is provided a semiconductor device that includes: a substrate; first and second electrodes formed on the substrate arranged in a first direction, the first and second electrodes being included in a first cell transistor; a first contact plug having bottom and top surfaces, the bottom surface thereof being in contact with the first electrode; a second contact plug having bottom, first side and top surfaces, the bottom surface thereof being in contact with the second electrode; a first insulation film formed on the top surfaces of the first and second contact plugs; a bit line formed on the first insulation film, the bit line extending in the first direction; a bit line contact plug formed through the first insulation film so as to connect the bit line and the top surface of the first contact plug; a first cell capacitor including a first lower electrode, the first lower electrode and the bit line being arranged in a second direction different from the first direction; a second insulation film arranged between the bit line and the first lower electrode so as to insulate from each other; and a first contact conductor connecting the first lower electrode to the first side surface of the second contact plug.

In another embodiment, there is provided a semiconductor device that includes: a semiconductor substrate; a first impurity diffusion region formed in the semiconductor substrate; a first contact plug having bottom, first side, second side and top surfaces, the bottom surface thereof being in contact with the first impurity diffusion region; a first insulation film being in contact with the top surface of the first contact plug; a first electrode being in contact with the first side surface of the first contact plug; and a second electrode being in contact with the second side surface of the first contact plug. The first insulation film is arranged between the first and second electrodes.

In another embodiment, there is provided a method of manufacturing a semiconductor device, comprising: forming first and second electrodes to be controlled on a surface of a substrate; forming first to third interlayer insulation layers on the surface of the substrate in succession; forming first and second contact plugs through the first to third interlayer insulation layers, bottom surfaces of the first and second contact plugs being in contact with the first and second electrodes to be controlled, respectively; depositing a first insulating material and a second insulating material on a top surface of the third interlayer insulation layer in succession; forming a bit line contact plug through the first and second insulating materials, a bottom surface of the bit line contact plug being electrically connected to the first contact plug; depositing a first conductive material on a top surface of the second insulating material, the first conductive material being electrically connected to the bit line contact plug; depositing a third insulating material, a fourth insulating material, and a fifth insulating material on a top surface of the first conductive material in succession; etching the fifth insulating material, the fourth insulating material, the third insulating material, the first conductive material, the second insulating material, and the first insulating material in succession based on a bit line pattern; depositing a sixth insulating material covering side surfaces of the first to fifth insulating materials and the first conductive material, a top surface of the fifth insulating material, and an exposed surface of the third interlayer insulation layer; covering a surface of the sixth insulating material with a second conductive material; etching back the second conductive material, the sixth insulating material, and the third interlayer insulation layer in succession; etching the sixth insulating material and the third interlayer insulation layer by isotropic wet etching, thereby exposing a side surface of the second contact plug; depositing a third conductive material being electrically connected to both a surface of the second conductive material and an exposed surface of the second contact plug, thereby forming a lower electrode being constituted by the second and third conductive materials; removing at least a part of the fourth insulating material and at least a part of the sixth insulating material, and forming a capacitor insulation film on an exposed surface of the lower electrode; and forming a top electrode being opposed to the lower electrode via the capacitor insulation film.

BRIEF DESCRIPTION OF THE DRAWINGS

FIGS. 6A to 13A, 15A, 17A, 19A, 21A, and 23A are sectional views of the semiconductor device 1 corresponding to the cross section along the line A-A of FIG. 2 in respective steps of manufacturing;

FIGS. 6B to 13B, 15B, 17B, 19B, 21B, and 23B are sectional views of the semiconductor device 1 corresponding to the cross section along the line B-B of FIG. 2 in respective steps of manufacturing;

DETAILED DESCRIPTION OF THE EMBODIMENTS

Preferred embodiments of the present invention will be explained below in detail with reference to the accompanying drawings.

Figure 1:
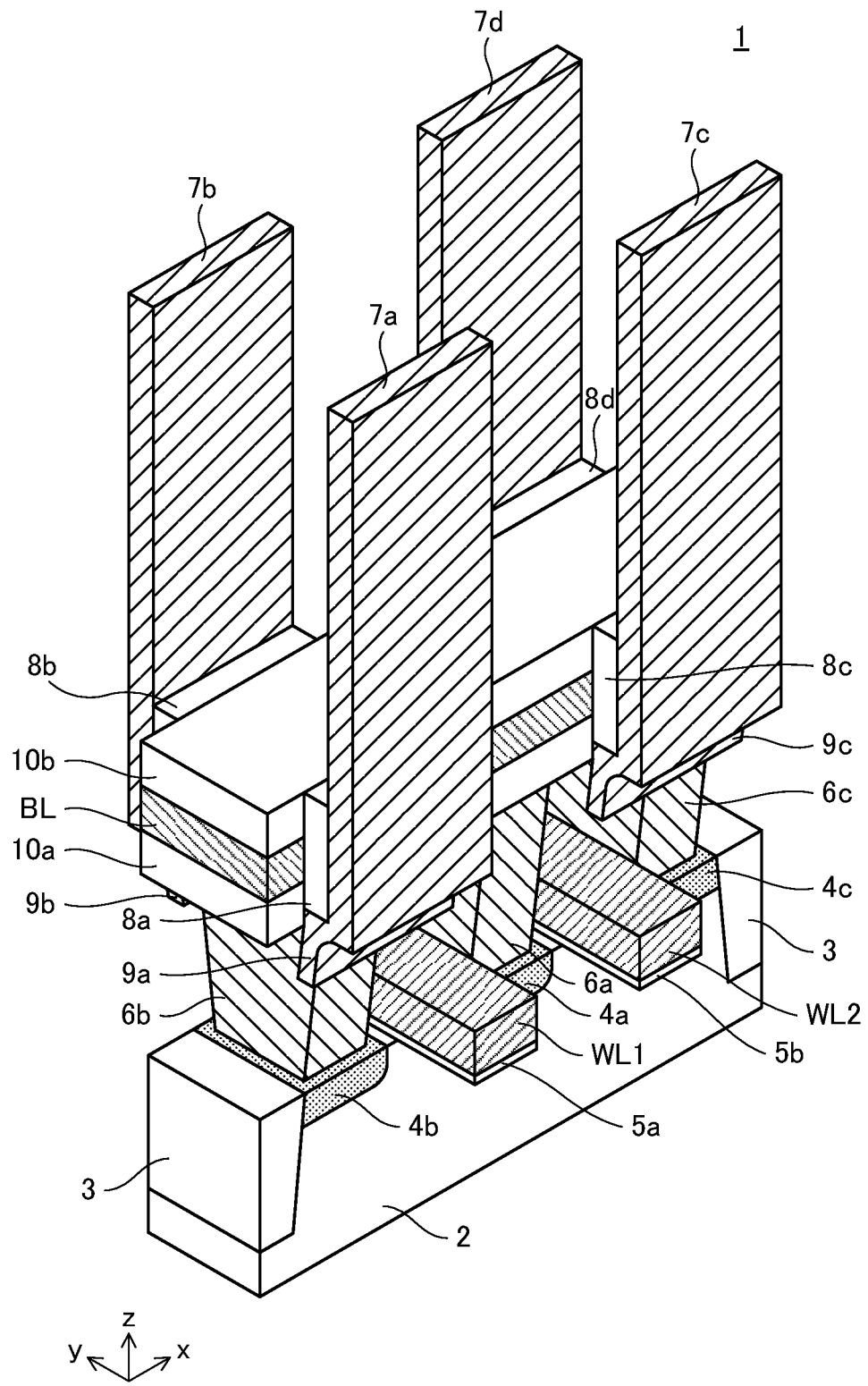
FIG. 1 is a perspective view schematically showing the three-dimensional structure of a semiconductor device 1 according to a preferred embodiment of the present invention.
Figure 2:
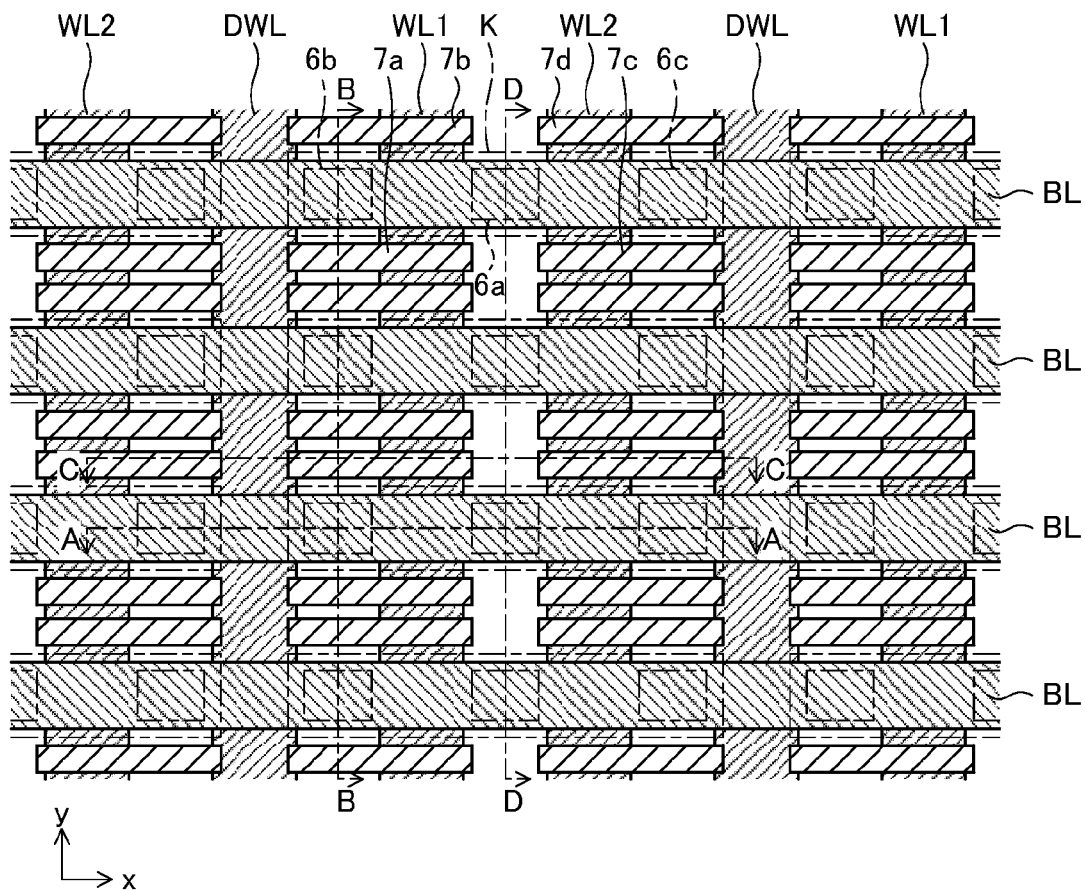
FIG. 2 is a plan view of the semiconductor device 1 shown in FIG. 1.

Referring now to FIG. 1, various types of components including an upper electrode 22 and first to third interlayer insulation layers 11a to 11c to be described later are omitted for easy visual understanding of the three-dimensional structure of the semiconductor device 1. FIG. 1 only shows an area corresponding to one of active regions K (FIG. 2) to be described later. In FIG. 2, the upper electrode 22 and the like are omitted to show various components transparently.

The semiconductor device 1 is a DRAM, whose components are formed on the surface of a substrate (silicon substrate) 2 as shown in FIGS. 1 and 3. The components of the semiconductor device 1 include a plurality of bit lines BL, a plurality of word lines WL1, a plurality of word lines WL2, and a plurality of dummy word lines DWL. In the following description, word lines WL1 and WL2 and dummy word lines DWL may sometimes be referred to collectively as word lines WL.

Bit lines BL are lines extending in an x direction. As shown in FIG. 2, bit lines BL are arranged at regular intervals in a y direction. Word lines WL are lines extending in the y direction. As shown in FIG. 2, word lines WL are arranged at regular intervals in the x direction. Specifically, a dummy word line DWL, a word line WL1, and a word line WL2 are juxtaposed in that order, and such sets are cyclically arranged in the x direction. Memory cells each including a cell transistor and a cell capacitor are arranged at the intersections of the bit lines BL and the word lines WL except the dummy word lines DWL. A plurality of memory cells are thereby arranged in a matrix.

Element isolation regions 3 are formed in the surface of the substrate 2, in areas between every two adjoining bit lines BL and under the dummy word lines DWL. Active regions K are thereby defined in a matrix as shown in FIG. 2. The element isolation regions 3 are formed by a so-called shallow trench isolation (STI) method. Two word lines WL (word lines WL1 and WL2) and one bit line BL pass through one active region K. Consequently, two memory cells are arranged in each active region K.

The following description will be given with a focus on a single active region K. As shown in FIG. 1, first to third impurity diffusion layers 4a to 4c (first to third electrodes to be controlled) are formed in the surface of the substrate 2 in the active region K. The impurity diffusion layers 4a to 4c are formed by implanting impurity ions into the surface of the substrate 2. The first impurity diffusion layer 4a is formed in the middle of the active region K. The second and third impurity diffusion layers 4b and 4c are formed on opposite sides of the first impurity diffusion layer 4a in the x direction. A word line WL1 (first word line) is arranged between the first impurity diffusion layer 4a and the second impurity diffusion layer 4b. A word line WL2 (second word line) is arranged between the first impurity diffusion layer 4 and the third impurity diffusion layer 4c. The word lines WL1 and WL2 are insulated from the substrate 2 by gate insulation films 5a and 5b (first and second gate insulation films) which are arranged between the word lines WL1 and WL2 and the surface of the substrate 2, respectively.

One of the cell transistors (first cell transistor) in the active region K is composed of the word line WL1, the first impurity diffusion layer 4a, and the second impurity diffusion layer 4b. The word line WL1, the first impurity diffusion layer 4a, and the second impurity diffusion layer 4b constitute the control electrode (gate), either one of the electrodes to be controlled (either one of the source and drain), and the other of the electrodes to be controlled (the other of the source and drain) of the first cell transistor, respectively.

The other cell transistor (second cell transistor) in the active region K is composed of the word line WL2, the first impurity diffusion layer 4a, and the third impurity diffusion layer 4c. The word line WL2, the first impurity diffusion layer 4a, and the third impurity diffusion layer 4c constitute the control electrode (gate), either one of the electrodes to be controlled (either one of the source and drain), and the other of the electrodes to be controlled (the other of the source and drain) of the second cell transistor, respectively.

Figure 3A:
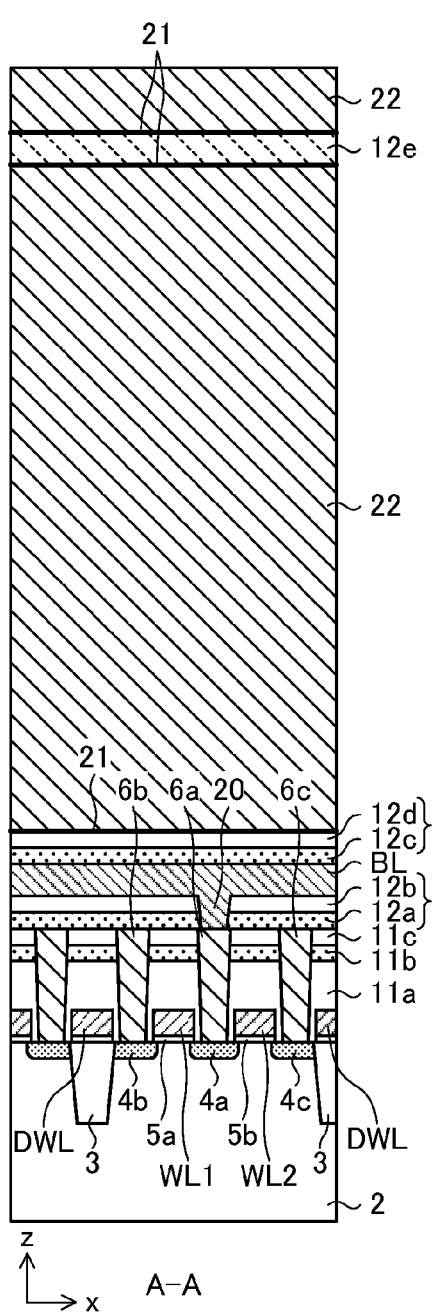
FIGS. 3A and 3B are sectional views of the semiconductor device 1 corresponding to cross sections along the lines A-A and B-B of FIG. 2, respectively.

As shown in FIGS. 1 and 3A, first to third contact plugs 6a to 6c are erected on the top surfaces of the first to third impurity diffusion layers 4a to 4c, respectively. First to third interlayer insulation layers 11a to 11c are stacked on the surface of the substrate 2. The first to third contact plugs 6a to 6c are made of a conductive material embedded in through holes that are formed through the first to third interlayer insulation layers 11a to 11c.

Figure 3B:
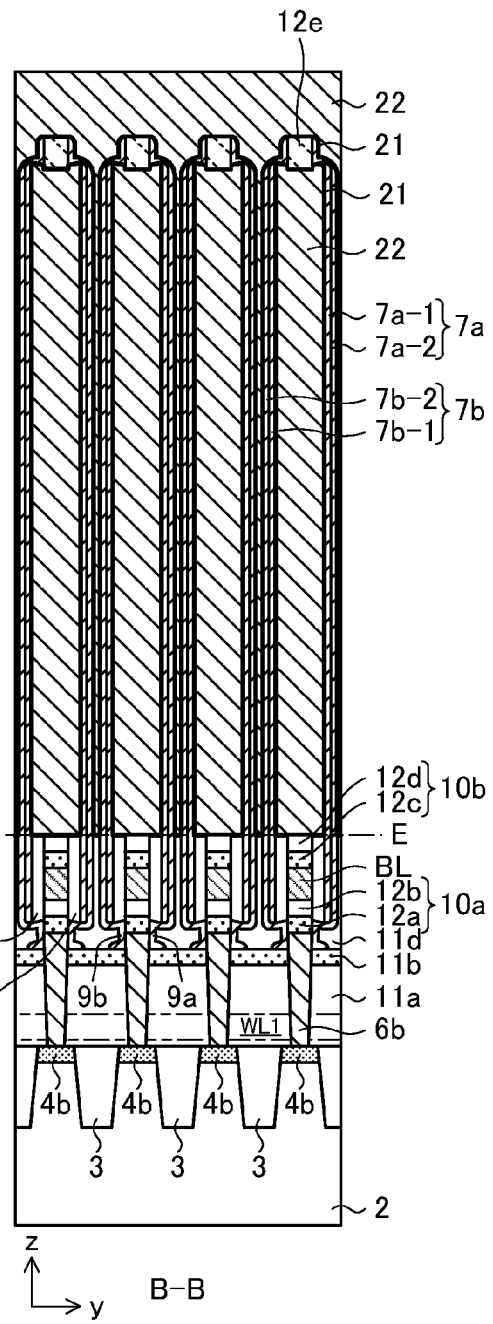

As shown in FIGS. 1, 3A, and 3B, a first insulation layer 10a is formed on the top surfaces of the first to third contact plugs 6a to 6c so as to extend in the x direction. A bit line BL is arranged on the top surface of the first insulation layer 10a. That is, as shown in FIGS. 1 and 2, the semiconductor device 1 is configured so that the bit line BL and the cell transistors lie in overlapping positions when seen in a plan view. As is clear from FIG. 1 and other diagrams, the direction of extension of the bit line BL and the direction connecting the first to third impurity diffusion layers 4a to 4c both are the same x direction. That is, the two directions are coincided with each other.

The top surface of the bit line BL is covered with a second insulation layer 10b. The second insulation layer 10b insulates an upper electrode 22 to be described later and the bit line BL from each other so that no capacitor is formed between the upper electrode 22 and the bit line BL. For that purpose, the second insulation layer 10b is formed in a sufficient thickness.

As shown in FIG. 3A, the bit line BL is electrically connected to the top surface of the first contact plug 6a through a bit line contact plug 20 which is formed through the first insulation layer 10a. The bit line BL is thus electrically connected with the first impurity diffusion layer 4a.

One of the cell capacitors (first cell capacitor) in the active region K is composed of lower electrodes 7a and 7b (first and second lower electrodes) which are shown in FIG. 1 and other diagrams, and a capacitor insulation film 21 and the upper electrode 22 which are shown in FIGS. 3A and 3B. Similarly, the other cell capacitor (second cell capacitor) in the active region K is composed of lower electrodes 7c and 7d (third and fourth lower electrodes) which are shown in FIG. 1 and other diagrams, and the capacitor insulation film 21 and the upper electrode 22 which are shown in FIGS. 3A and 3B. Such structures will be described in detail below.

As shown in FIGS. 1 and 3B, the lower electrodes 7a to 7d each are a conductor of plate-like shape that is long in a z direction. As shown in FIG. 2, the lower electrodes 7a to 7d have a length generally as much as two word lines WL in the x direction. As shown in FIGS. 2 and 3B, the lower electrodes 7a to 7d have a length in the y direction such that there is a sufficient distance from the lower electrodes of other capacitors adjoining in the y direction (a distance that precludes conduction and parasitic capacitance).

As shown in FIGS. 1 and 3B, the lower electrode 7a is arranged beside either one of the side surfaces of the bit line BL via a first insulation film 8a. The first insulation film 8a is provided in order to insulate the lower electrode 7a from the bit line BL. As shown in FIG. 2, the position of the lower electrode 7a in the x direction generally overlaps with those of the second contact plug 6b and the word line WL1. The bottom end of the lower electrode 7a is connected to an end of a first contact conductor 9a, which bends from the lower electrode 7a to the bit line BL side (from the bottom end of the lower electrode 7a to a side surface of the second contact plug 6b). The other end of the first contact conductor 9a is in contact with the side surface of the second contact plug 6b, whereby the lower electrode 7a and the second contact plug 6b are electrically connected.

Like the lower electrode 7a, the lower electrodes 7b to 7d are arranged beside the bit line BL. Specifically, as shown in FIGS. 1 and 3B, the lower electrode 7b is arranged beside the other side surface of the bit line BL via a second insulation film 8b. As shown in FIG. 2, the lower electrode 7b is positioned so as to generally overlap the second contact plug 6b and the word line WL1 in the x direction. In other words, the lower electrode 7b is arranged on the other side of the bit line BL from the lower electrode 7a so as to be opposed to the lower electrode 7a.

The lower electrode 7c is arranged beside the one side surface of the bit line BL via a third insulation film 8c. The lower electrode 7c is positioned so as to generally overlap the third contact plug 6c and the word line WL2 in the x direction. The lower electrode 7d is arranged beside the other side surface of the bit line BL via a fourth insulation film 8d. The lower electrode 7d is positioned so as to generally overlap the third contact plug 6c and the word line WL2 in the x direction. In other words, the lower electrode 7d is arranged on the other side of the bit line BL from the lower electrode 7c so as to be opposed to the lower electrode 7c.

Like the first insulation film 8a, the second to fourth insulation films 8b to 8d are provided in order to insulate the corresponding lower electrodes from the bit line BL. As with the first contact conductor 9a, the bottom ends of the lower electrodes 7b to 7d are connected to second to fourth contact conductors 9b to 9d, respectively. The second to fourth contact conductors 9b to 9d are intended to electrically connect the corresponding lower electrodes to the corresponding contact plugs. FIG. 1 shows the second contact conductor 9b corresponding to the lower electrode 7b and the third contact conductor 9c corresponding to the lower electrode 7c.

With the foregoing configuration, the lower electrode 7a and the lower electrode 7b are electrically integrated through the second contact plug 6b, whereby the lower electrode of the first cell capacitor is constituted. Similarly, the lower electrode 7c and the lower electrode 7d are electrically integrated through the third contact plug 6c, whereby the lower electrode of the second cell capacitor is constituted.

As shown in FIG. 3B, the vicinity of the bottom ends of the lower electrodes 7a to 7d is filled with a fourth interlayer insulation layer 11d. The fourth interlayer insulation layer 11d is formed so that its top surface is flush with the top surfaces of the first to fourth insulation films 8a to 8d and the top surface of the second insulation layer 10b at a plane E shown in FIG. 3B. As shown in FIGS. 3A and 3B, the capacitor insulation film 21 is formed to cover the surfaces at the plane E, the surfaces of the lower electrodes 7a to 7d exposed above the plane E, and the surface of a support insulation film 12e. The support insulation film 12e is provided in order to mechanically support the lower electrodes 7a to 7d.

The upper electrode 22 is arranged to be opposed to the lower electrodes 7a to 7d via the capacitor insulation film 21. Specifically, the upper electrode 22 is made of conductive material that fills the space between the lower electrodes 7a to 7d (above the plane E).

The operation of the semiconductor device 1 will be described below.

Suppose that a word line WL1 is activated. In each of a plurality of active regions K the word line WL1 passes through, a channel is created in the surface of the substrate 2 between the first impurity diffusion layer 4a and the second impurity diffusion layer 4b. The first impurity diffusion layer 4a and the second impurity diffusion layer 4b become electrically conductive with each other, whereby the first cell capacitor is electrically connected to the bit line BL in each active region K. This makes it possible to read and write the first cell capacitor through the bit line BL.

Similarly, suppose that a word line WL2 is activated. In each of a plurality of active regions K the word line WL2 passes through, a channel is created in the surface of the substrate 2 between the first impurity diffusion layer 4a and the third impurity diffusion layer 4c. The first impurity diffusion layer 4a and the third impurity diffusion layer 4c become electrically conductive with each other, whereby the second cell capacitor is electrically connected to the bit line BL in each active region K. This makes it possible to read and write the second cell capacitor through the bit line BL.

As has been described above, according to the semiconductor device 1, it is possible to provide a semiconductor device that includes bit lines BL of straight shape, and wherein the longitudinal direction of cell transistors (x direction) is parallel to the direction of extension of the bit lines BL, and the bit lines BL are laid in positions overlapping the cell transistors when seen in a plan view. Such configuration provides improved workability and facilitates ensuring yields as compared to the cases of forming bit lines in a wavy wiring pattern, arranging cell transistors with their longitudinal direction oblique to bit lines, and forming bit lines in areas between cell transistors and arranging bit line contact plugs across the boundaries between the bit lines and cell transistors when seen in a plan view.

Since the semiconductor device 1 includes plate-like lower electrodes, it is relatively easily possible to provide cell capacitors of high capacities as compared to the aforementioned case where crown-shaped cell capacitors (cell capacitors having a cylindrical lower electrode) are used. In this respect, detailed description will be given below.

Figure 4A:
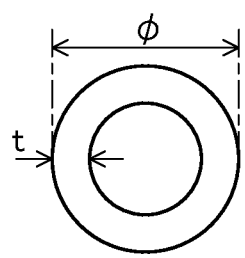
FIGS. 4A and 4B are diagrams showing a cylindrical lower electrode which is used for crown-shaped cell capacitors.
Figure 4C:
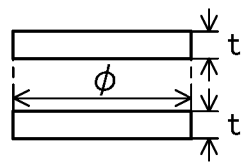
FIGS. 4C and 4D are diagrams showing a plate-like lower electrode which is used for cell capacitors (hereinafter, referred to as "twin-plate type") of the semiconductor device 1.
Figure 4B:
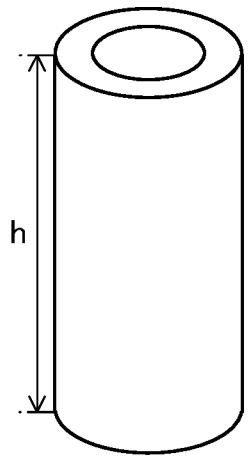
Figure 4D:
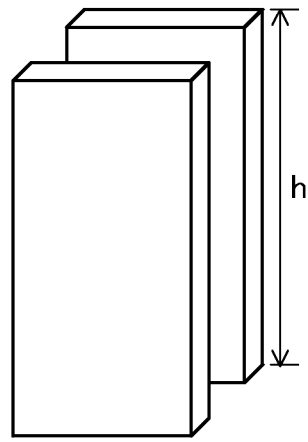
Figure 5:
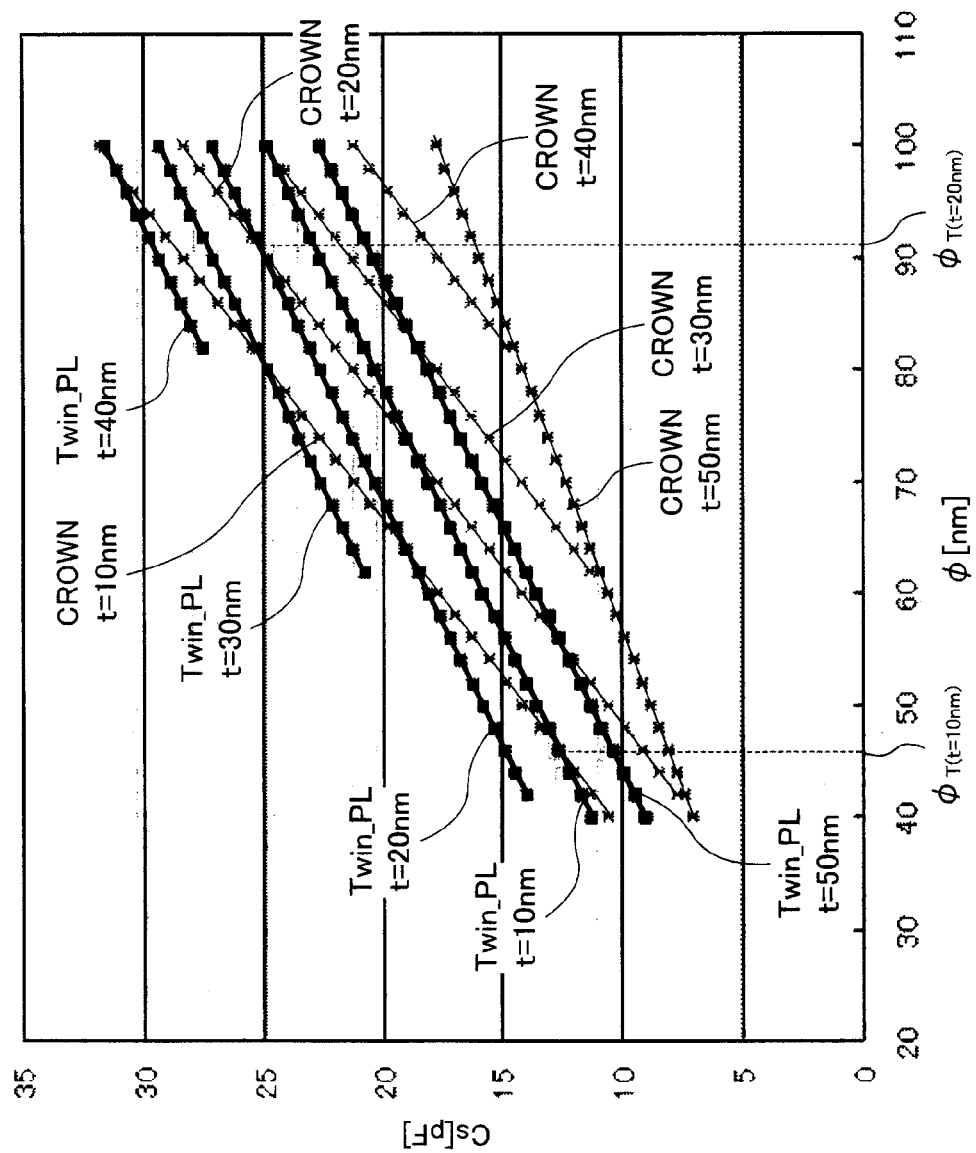
FIG. 5 is a graph showing calculations of the relationship between the width $\phi$ of a lower electrode in the x direction (=minimum feature size) and a capacitance Cs for each of the two types of cell capacitors shown in FIGS. 4A to 4D, with electrode thicknesses t (FIGS. 4A and 4C) of 10 nm, 20 nm, 30 nm, 40 nm, and 50 nm.

Turing to FIGS. 4A to 4D and 5, FIGS. 4A and 4C are schematic plan views of the lower electrodes. FIGS. 4B and 4D are schematic perspective views of the lower electrodes. For calculation of FIG. 5, the thickness of the capacitor insulation film 21 is assumed to be 0.9 nm, and the height h of the lower electrodes 1.5 μl. In FIG. 5, calculations for twin-plate cell capacitors are denoted by "Twin_PL". Calculations for crown-shaped cell capacitors are denoted by "CROWN".

As can be seen from FIG. 5, the rates of increase in the capacitance Cs with respect to an increase in the width $\phi$ are smaller for twin-plate cell capacitors than for crown-shaped cell capacitors. The capacitance Cs of a twin-plate cell capacitor increases as the electrode thickness t increases, except for t=50 nm. In contrast, the capacitance Cs of a crown-shaped cell capacitor increases as the electrode thickness t decreases.

As a result of the foregoing properties, given the same electrode thickness t, there is a certain threshold width $\phi_T$ such that a twin-plate cell capacitor has a higher capacitance Cs if the width $\phi$ is smaller than the width $\phi_T$, and a crown-shaped cell capacitor has a higher capacitance Cs if the width $\phi$ is greater than the width $\phi_T$. Such a width $\phi_T$ can be expressed as a function of the electrode thickness t. Specifically, $\phi_T \approx t/0.22$. FIG. 5 shows widths $\phi_T$ for electrode thicknesses t=10 nm and 20 nm ($\phi_{T(t=10\ nm)} \approx 45.5$ nm; $\phi_{T(t=20\ nm)} \approx 90.9$ nm), respectively.

With the progress of miniaturization, the width $\phi$, or minimum feature size, has been decreasing recently. Specifically, minimum feature sizes of 50 nm or smaller have been used. Meanwhile, there is a limit to reducing the electrode thickness t because some mechanical strength is needed. Lower limits are at best 20 nm. Consequently, the foregoing threshold $\phi_T$ determined by the electrode thickness t is approximately 90.9 nm or greater.

That is, a practical range of values of the width $\phi$ is 50 nm and smaller, at least in which range twin-plate cell capacitors always have a capacitance Cs greater than that of crown-shaped cell capacitors. Consequently, the semiconductor device 1 using such twin-plate cell capacitors can provide a capacitance Cs greater than with crown-shaped cell capacitors.

Twin-plate cell capacitors are also advantageous in terms of workability. More specifically, crown-shaped cell capacitors cause tapering during processing. The tapering reduces the internal space of the lower electrodes with a decrease in capacitance. The finer the traces, the more significant the decrease in capacitance. On the other hand, twin-plate cell capacitors have lower electrodes of independent plate-like shape, and thus hardly decrease in capacitance even if the lower electrodes undergo tapering. Consequently, twin-plate cell capacitors can provide higher capacitances in smaller areas as compared to crown-shaped cell capacitors.

Turning to FIGS. 6A to 23B, a method of manufacturing the semiconductor device 1 according to the present embodiment will be described in detail.

Figure 6A:
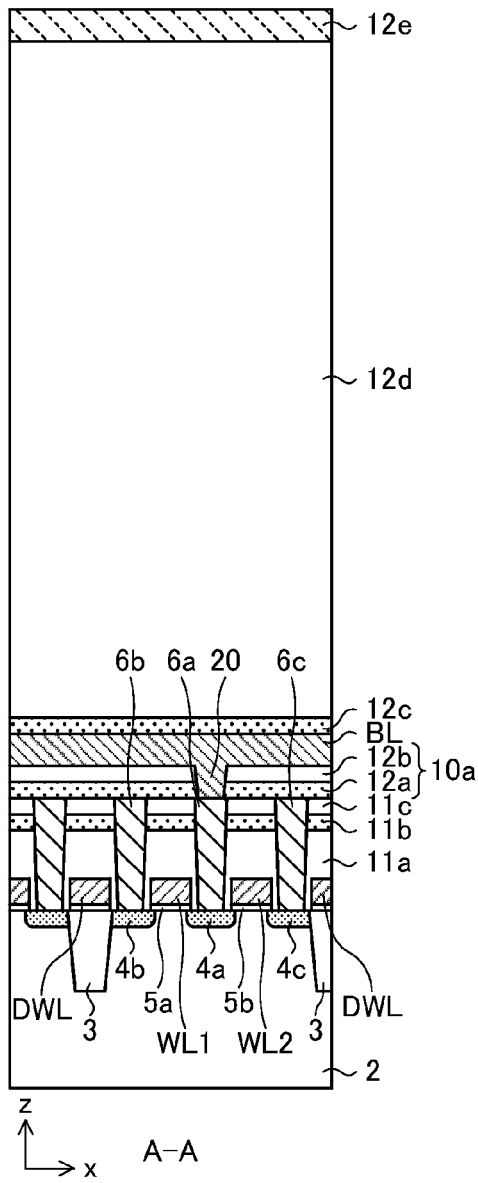
Figure 6B:
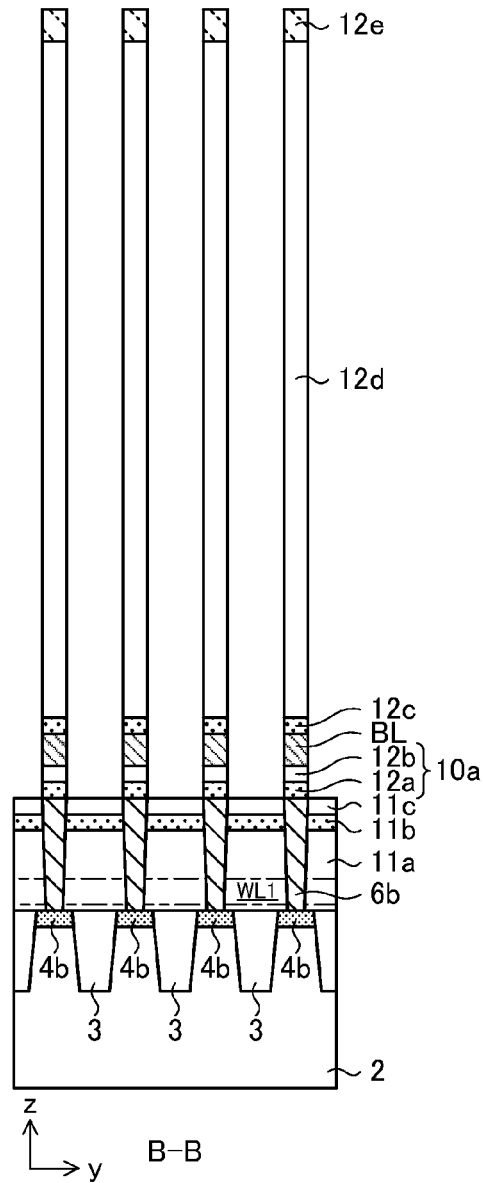

Initially, as shown in FIGS. 6A and 6B, trenches are formed in the surface of the substrate 2. The trenches are filled with a silicon oxide film to form element isolation regions 3. Inside active regions K defined by the element isolation regions 3, impurity ions are implanted into the surface of the substrate 2 to form first to third impurity diffusion layers 4a to 4c.

Next, the surface of the substrate 2 is thermally oxidized. A polysilicon, tungsten, or other metal film, or a stack of such films is deposited thereon as a conductive material. The resultant is then patterned into a word line pattern to form gate insulation films 5a and 5b and word lines WL as shown in FIGS. 6A and 6B.

Next, first to third interlayer insulation layers 11a to 11c are formed on the surface of the substrate 2 in succession. The first and third interlayer insulation layers 11a and 11c are made of a silicon oxide film. The second interlayer insulation layer 11b is made of a silicon nitride film. The silicon oxide films and silicon nitride film can be formed by, but not limited to, chemical vapor deposition (CVD). The same holds for other silicon oxide films and silicon nitride films to be formed later. Preferred thicknesses of the first to third interlayer insulation layers 11a to 11c are 100 nm, 40 nm, and 50 nm, respectively. Although not shown, the interlayer insulation layer 11a may have a complicated mixed structure of silicon oxide films and silicon nitride films in order to form the contact plugs 6a to 6c in a self-aligned fashion with respect to the gate electrodes WL1, WL2, and DWL.

After the formation of the first to third interlayer insulation layers 11a to 11c, through holes are formed through the first to third interlayer insulation layers 11a to 11c in respective positions corresponding to the first to third impurity diffusion layers 4a to 4c. The interiors of the through holes are filled with a conductive material to form first to third contact plugs 6a to 6c.

Next, a first insulating material 12a and a second insulating material 12b are deposited on the top surface of the third interlayer insulation layer 11c in succession. The first insulating material 12a is a silicon nitride film. The second insulating material 12b is a silicon oxide film. The first and second insulating materials 12a and 12b constitute the first insulation layer 10a described above. Preferred thicknesses of the first and second insulating materials 12a and 12b are 50 nm and 30 nm, respectively. Through holes are formed through the insulating materials. The thorough holes are filled with a conductive material to form bit line contact plugs 20 which make contact with the first contact plugs 6a at the bottom.

Next, a conductive material (first conductive material) to be bit lines BL, a third insulating material 12c, a fourth insulating material 12d (cell capacitor forming insulation film), and a fifth insulating material 12e (support insulation film) are deposited on the top surface of the second insulating material 12b in succession. The third and fifth insulating materials 12c and 12e are silicon nitride films. The fourth insulating material 12d is a silicon oxide film. The conductive material to be bit lines BL is formed as a polysilicon, tungsten, or other metal film, or a stack of such films. Preferred thicknesses of the third to fifth insulating materials 12c to 12e are 40 nm, 1500 nm, and 100 nm, respectively.

After the fifth insulating material 12e is formed, the fifth insulating material 12e, the fourth insulating material 12d, the third insulating material 12c, the conductive material to be bit lines BL, the second insulating material 12b, and the first insulating material 12a are etched in succession by photolithography based on a bit line pattern. By the steps so far, bit lines BL are completed as shown in FIGS. 6A and 6B.

Figure 7A:
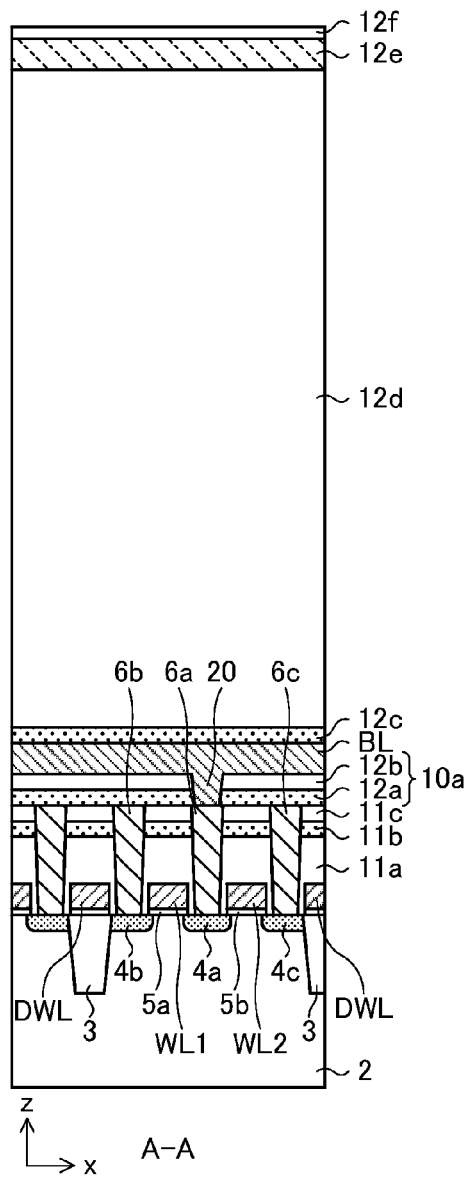
Figure 7B:
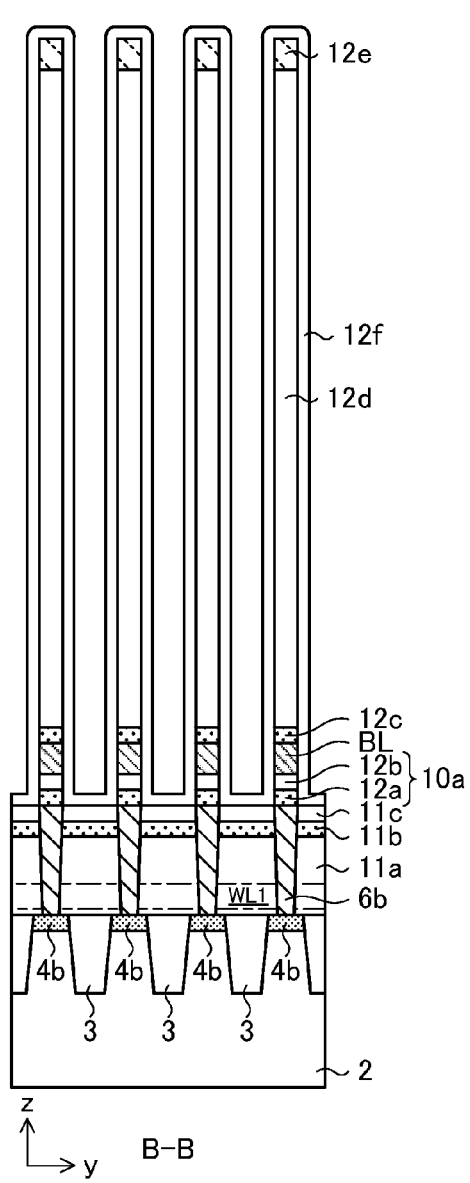
Figure 8A:
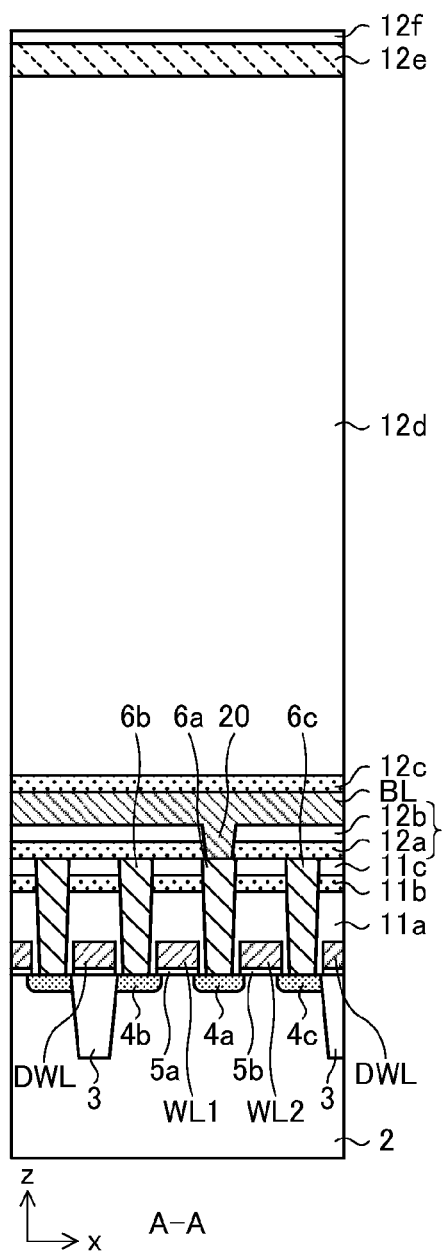
Figure 8B:
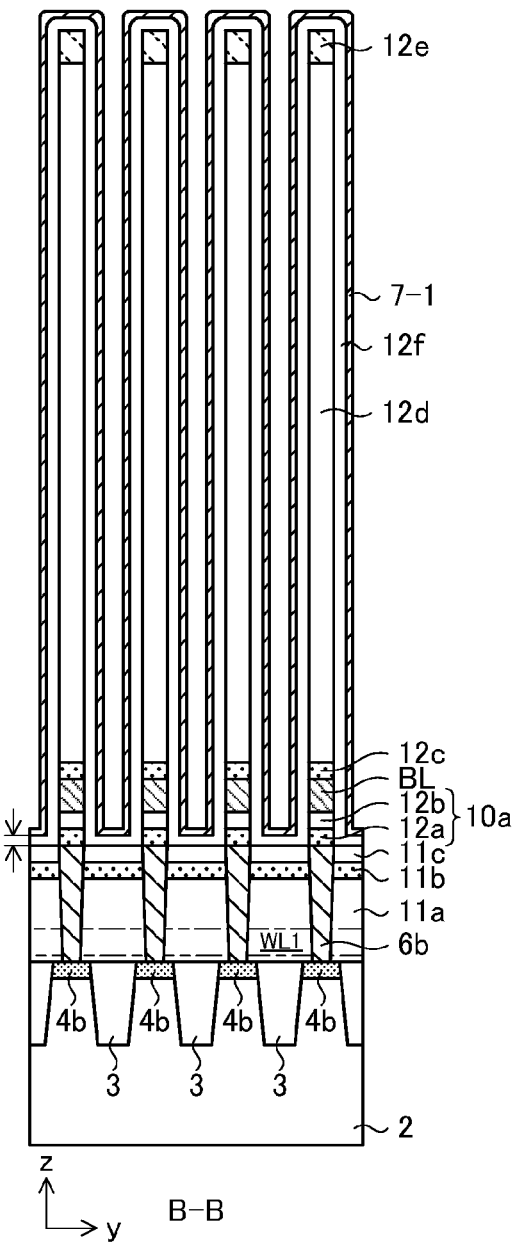

Next, as shown in FIGS. 7A and 7B, a sixth insulating material 12f is deposited on the surface of the substrate 2. The sixth insulating material 12f is a silicon oxide film. Consequently, the side surfaces of the first to fifth insulating materials 12a to 12e and the bit lines BL, the top surface of the fifth insulating material 12e, and the exposed surfaces of the third interlayer insulation layer 11c are covered with the sixth insulating material 12f. As shown in FIGS. 8A and 8B, a second conductive material 7-1 is deposited further so that the surface of the sixth insulating material 12f is covered with the second conductive material 7-1. The second conductive material 7-1 serves as a conductive underlayer film when forming a third conductive material 7-2 to be described later.

The preferred amount of deposition of the sixth insulating material 12f is such that the portions of the sixth insulation film 12f formed on horizontal surfaces (the portions formed on the exposed surfaces of the third interlayer insulation layer 11c) have a thickness (thickness d shown in FIG. 8B) smaller than the thickness of the first insulating material 12a. The reason is to prevent the second insulating material 12b from being etched during isotropic etching of the sixth insulating material 12f in a step to be described later. Specifically, the sixth insulating material 12f is preferably deposited to a thickness d of around 20 nm. A preferred thickness of the second conductive material 7-1 is 10 nm.

Figure 9A:
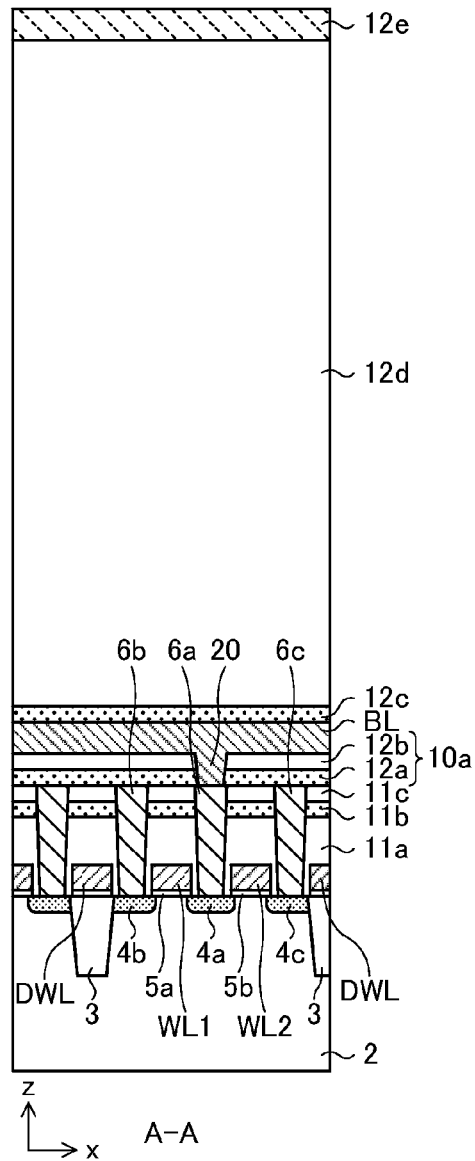
Figure 9B:
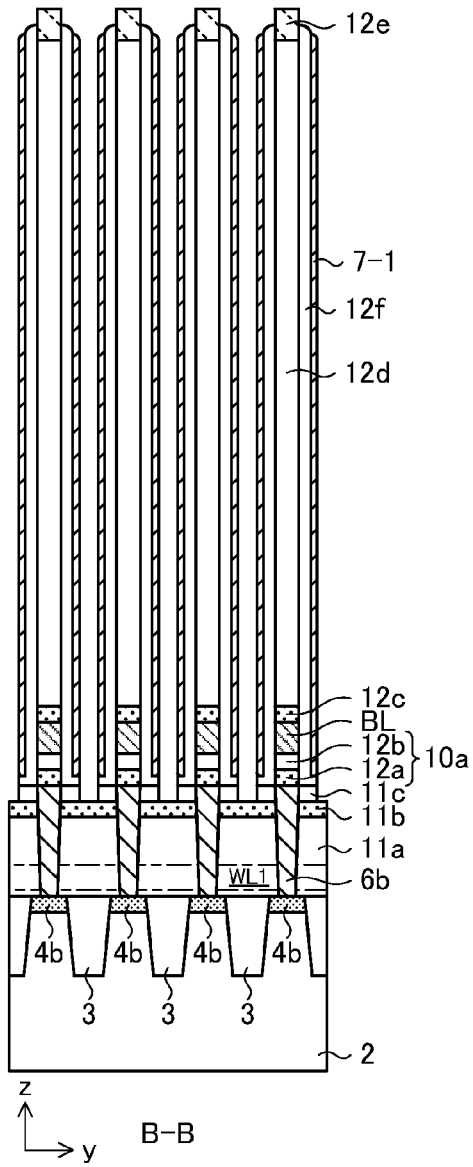

Next, the second conductive material 7-1 and the silicon oxide films (the sixth insulating material 12f and the third interlayer insulation layer 11c) are anisotropically etched back in succession. The silicon oxide films are etched back by highly selective etching so as not to etch the silicon nitride film (second interlayer insulation layer 11b). As shown in FIGS. 9A and 9B, the etchback separates the second conductive material 7-1 in the y direction to expose the second interlayer insulation layer 11b in areas between the bit lines BL. The top ends of the fifth insulating material 12e are also exposed.

Figure 10A:
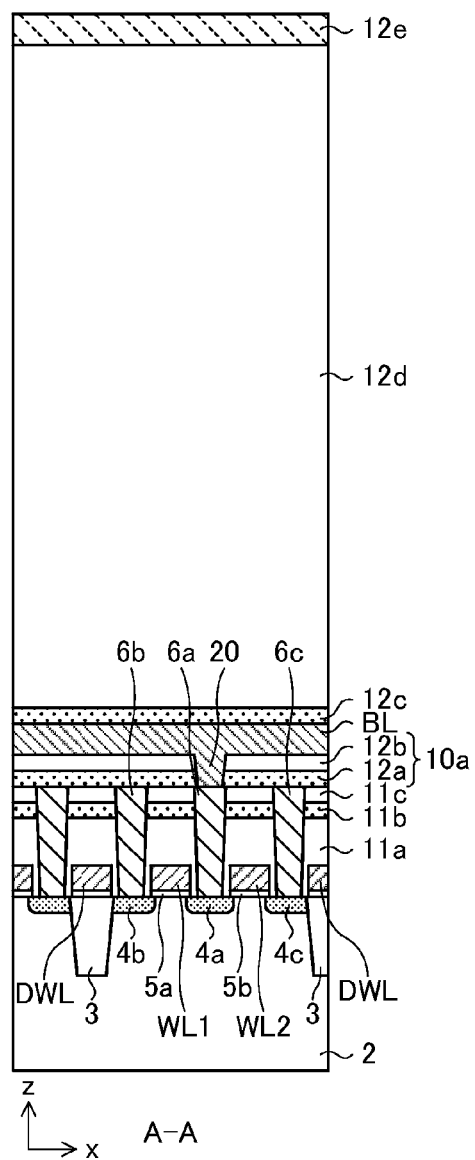
Figure 10B:
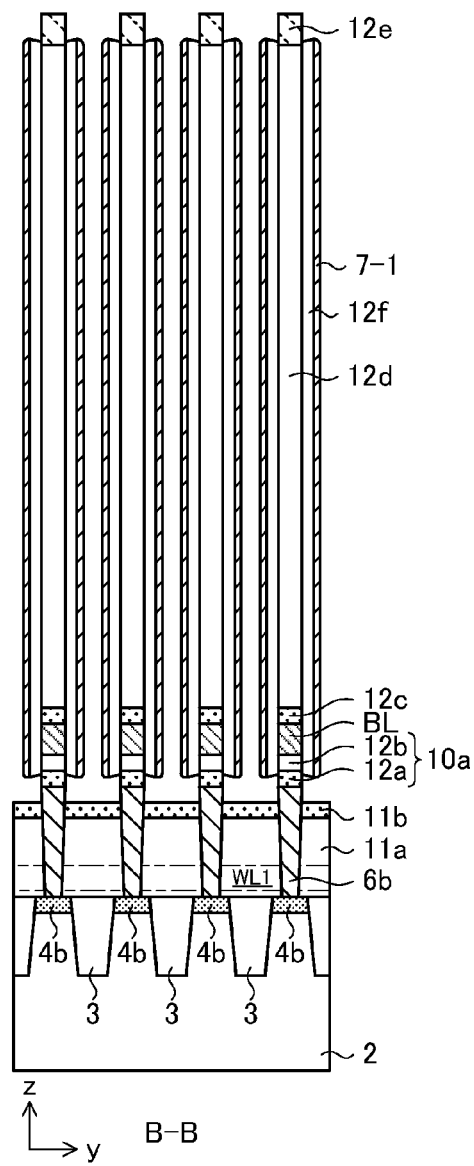

Next, the silicon oxide film is etched by isotropic etchback, whereby the side surfaces of the top ends of the second contact plugs 6b are exposed as shown in FIGS. 10A and 10B. Although not shown, the side surfaces of the top ends of the first and third contact plugs 6a and 6c are exposed as well.

Figure 11A:
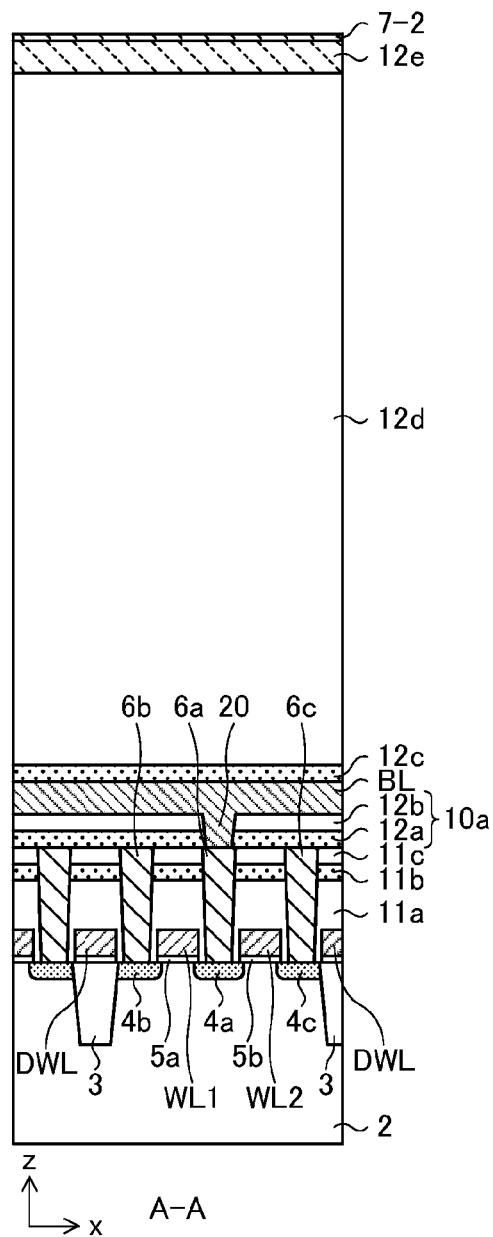
Figure 11B:
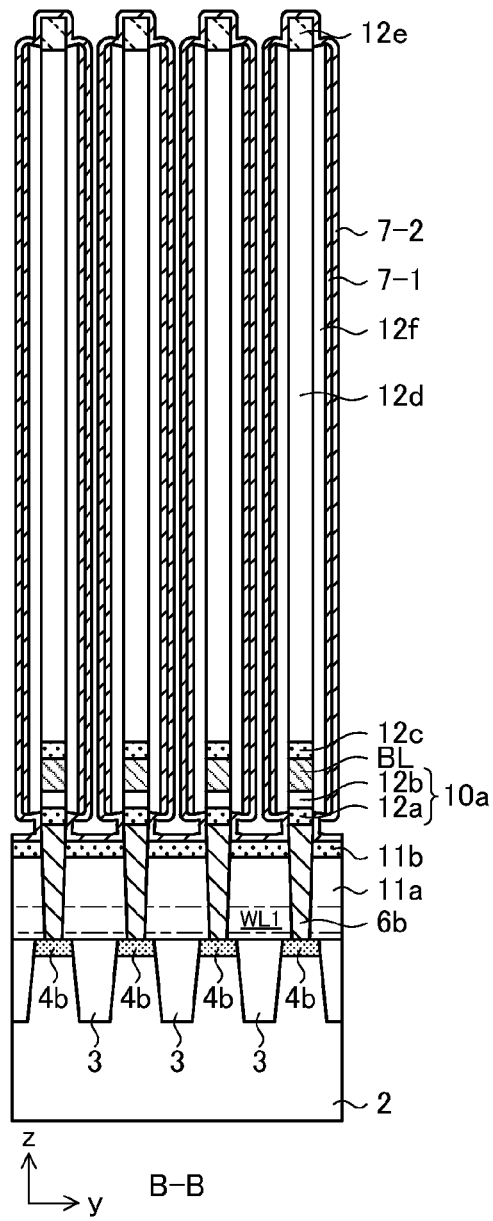
Figure 12A:
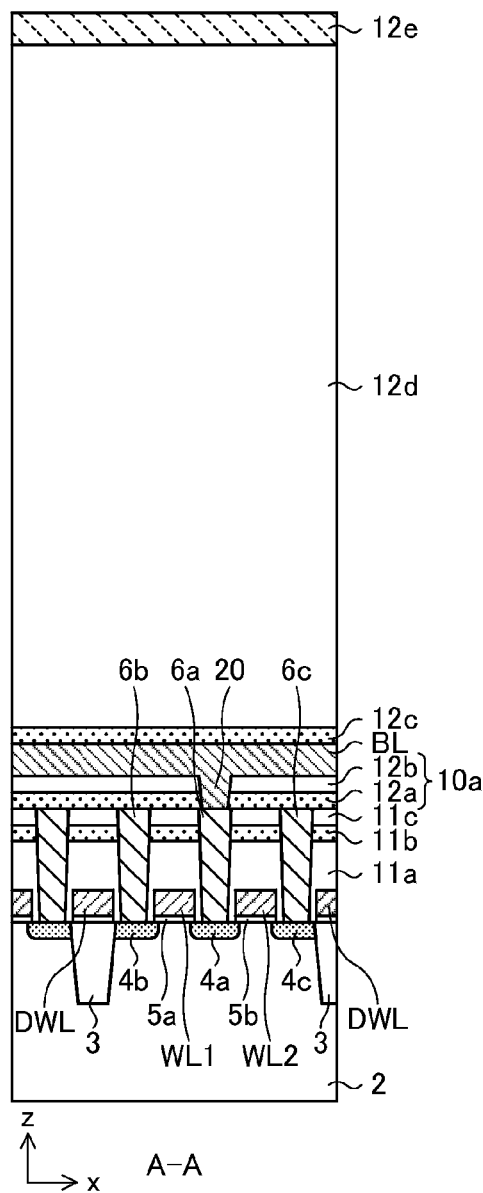
Figure 12B:
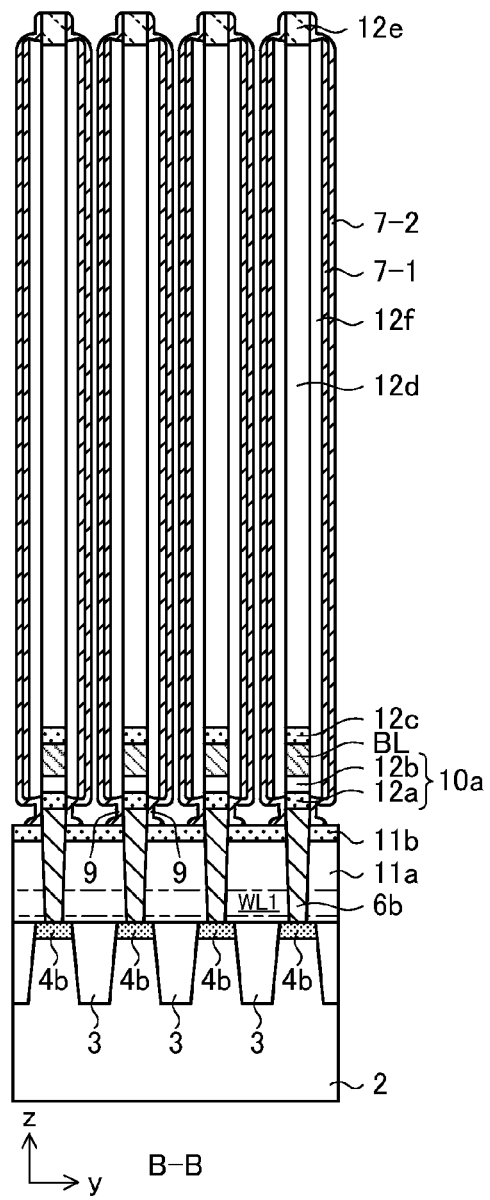
Figure 13A:
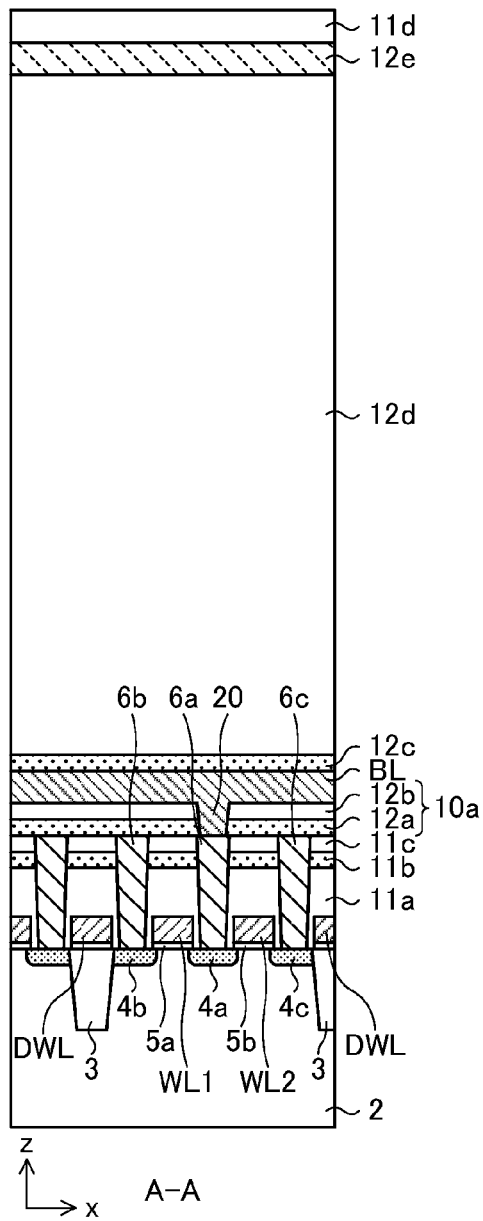
Figure 13B:
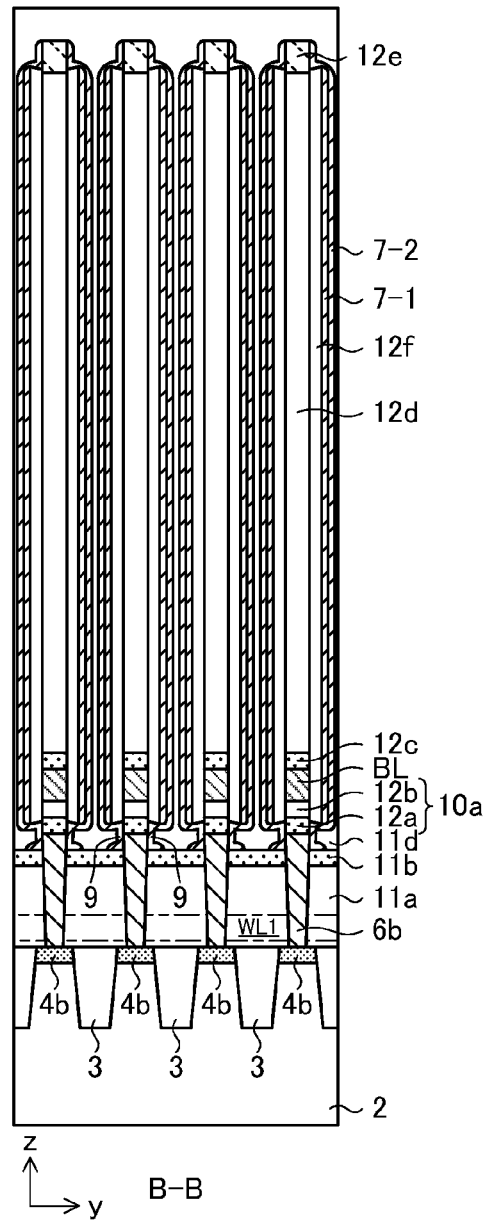

Next, a third conductive material 7-2 is deposited as shown in FIGS. 11A and 11B. Anisotropic etchback is performed to separate the third conductive material 7-2 in the y direction as shown in FIGS. 12A and 12B. By the steps so far, lower electrodes made of the second conductive material 7-1 and the third conductive material 7-2 are formed along with contact conductors 9. The contact conductors 9 electrically connect the bottom ends of the lower electrodes to the side surfaces of the top ends of the first to third contact plugs 6a to 6c. At this point in time, the lower electrodes and contact conductors 9 are yet to be separated in the x direction. The division is performed in a step to be described later.

Figure 14A:
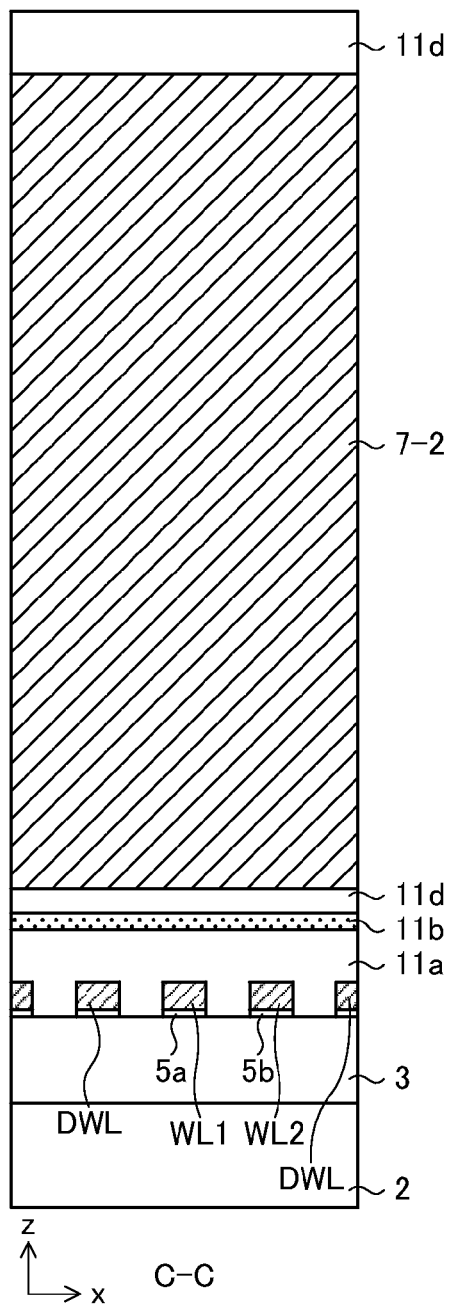
FIGS. 14A, 16A, 18A, 20A, and 22A are sectional views of the semiconductor device 1 corresponding to the cross section along the line C-C of FIG. 2 in respective steps of manufacturing.
Figure 14B:
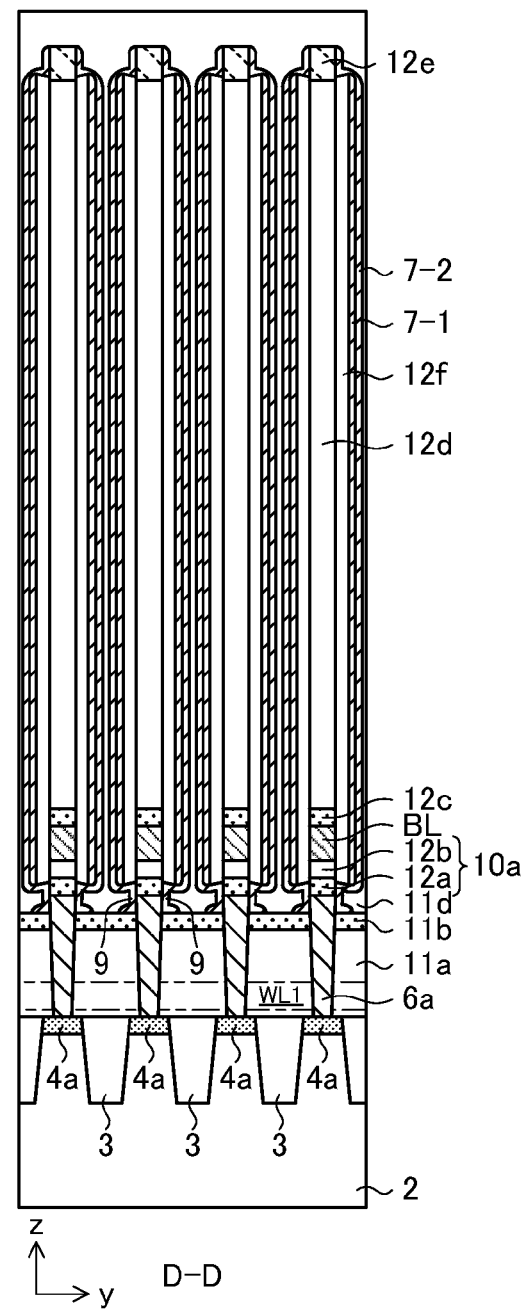
FIGS. 14B, 16B, 18B, 20B, and 22B are sectional views of the semiconductor device 1 corresponding to the cross section along the line D-D of FIG. 2 in respective steps of manufacturing.
Figure 15A:
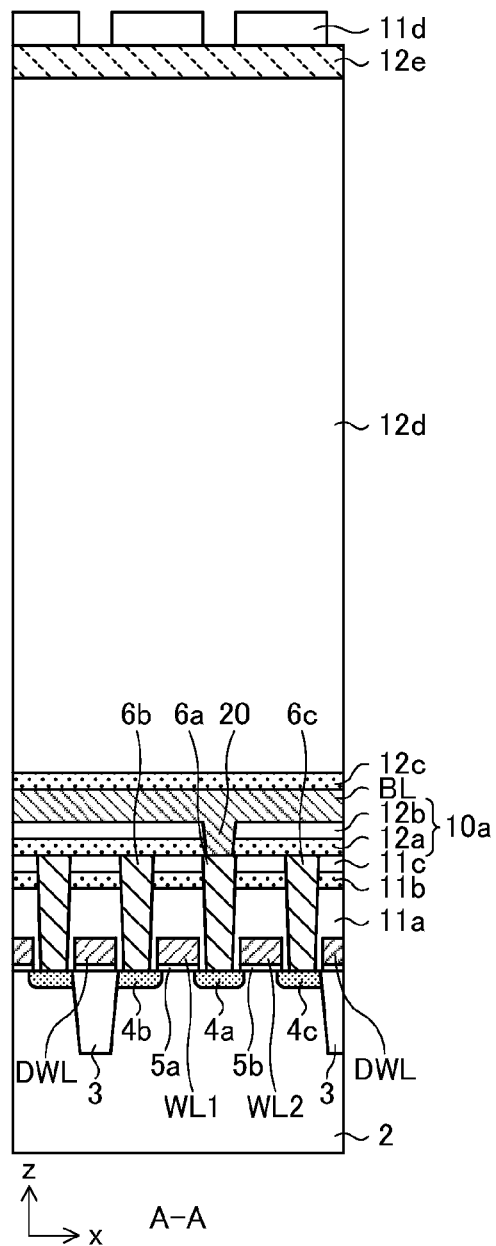
Figure 15B:
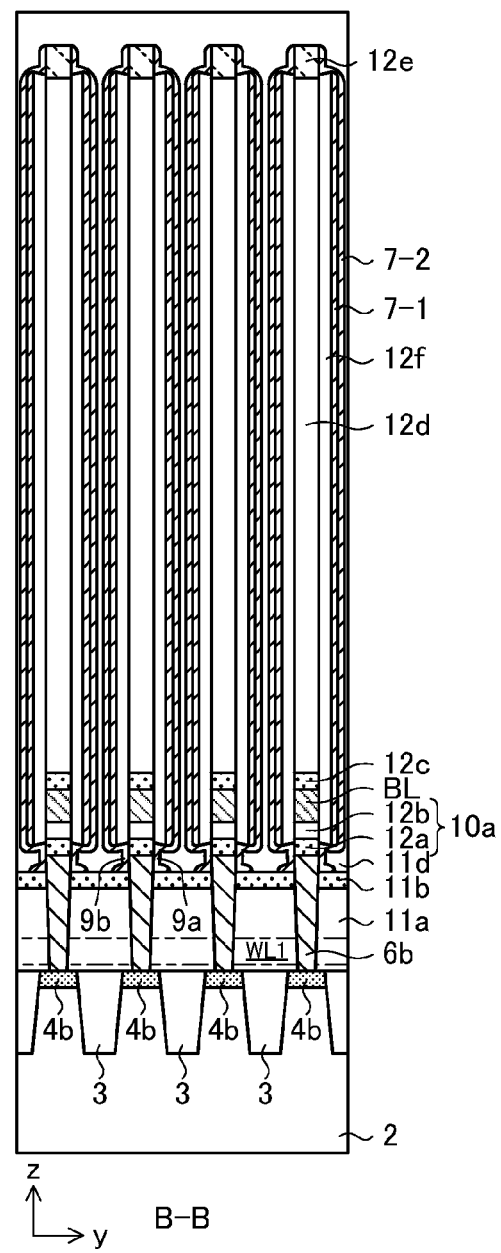
Figure 16A:
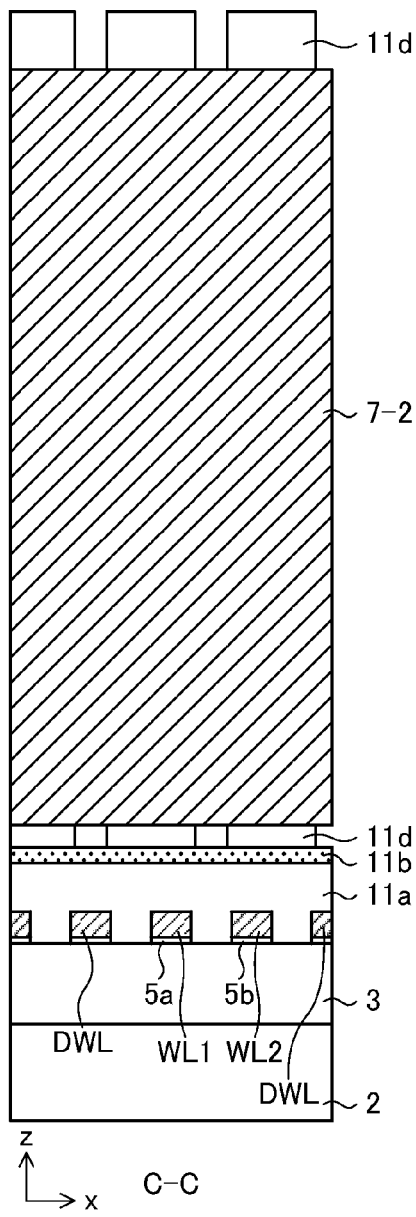
Figure 16B:
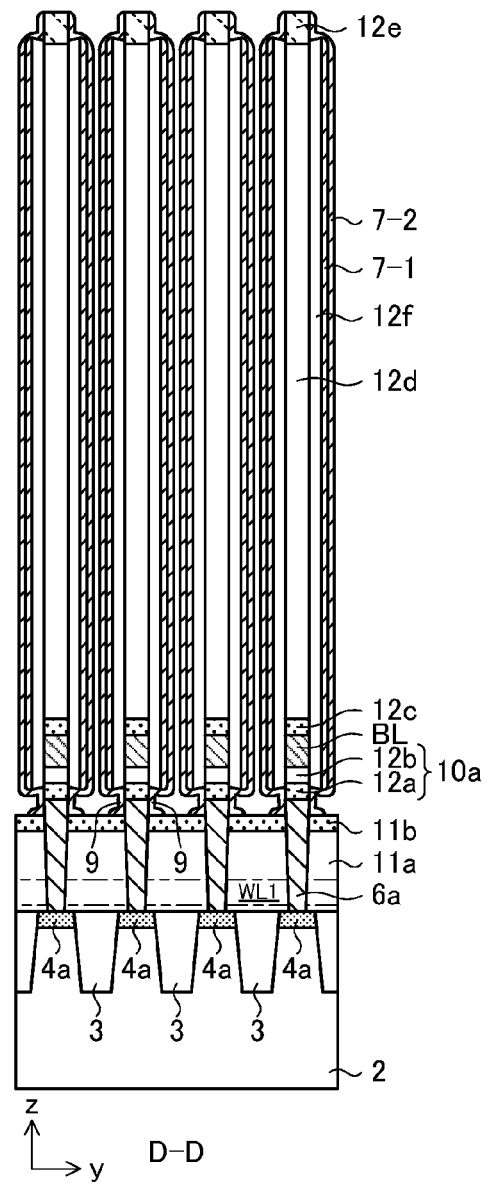
Figure 17A:
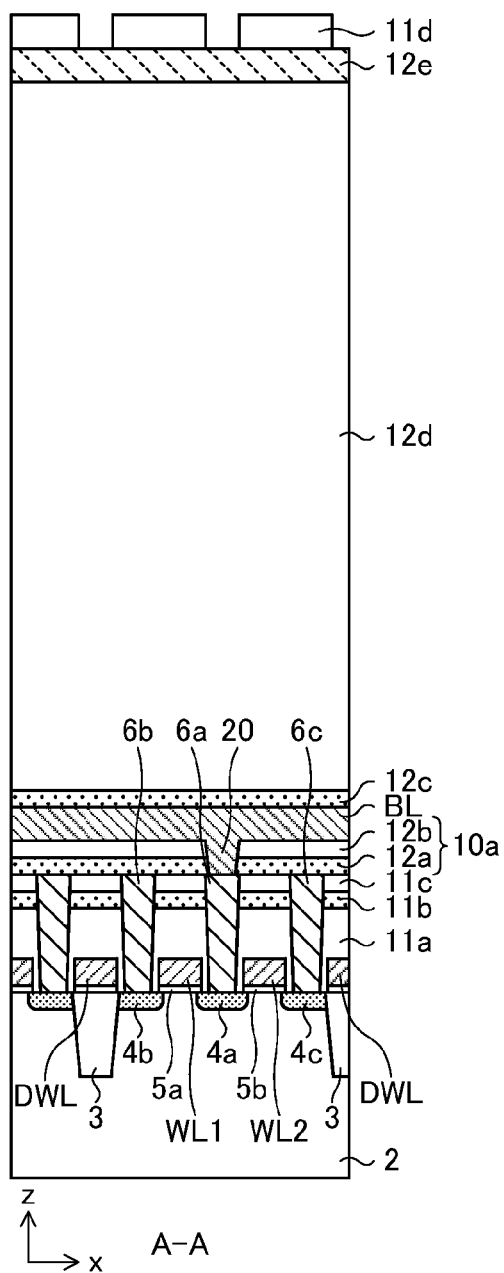
Figure 17B:
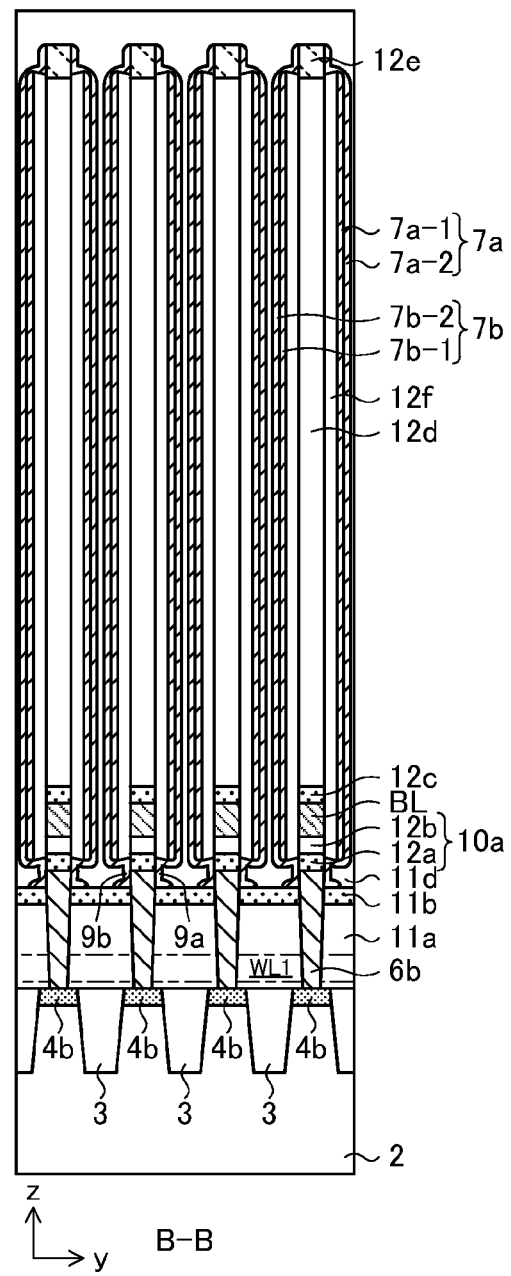
Figure 18A:
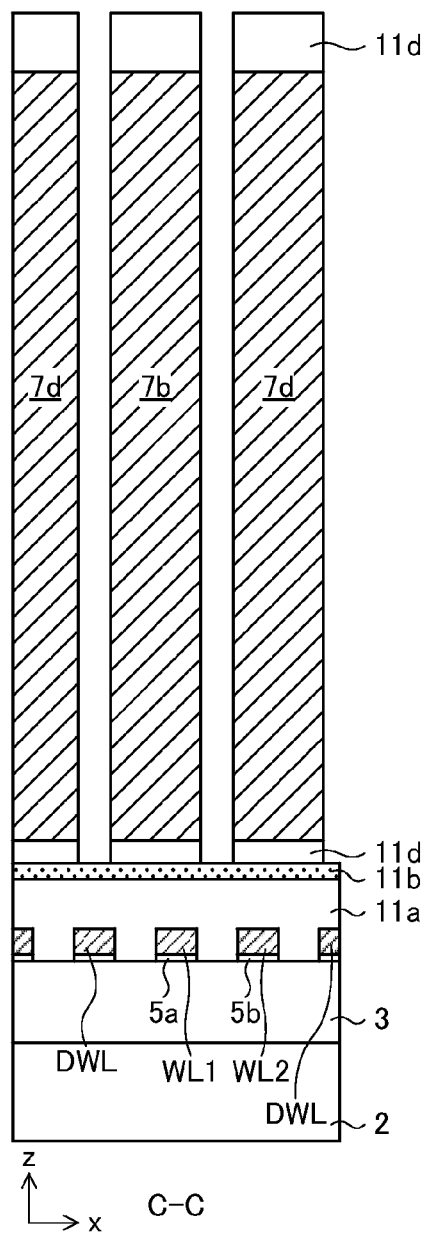
Figure 18B:
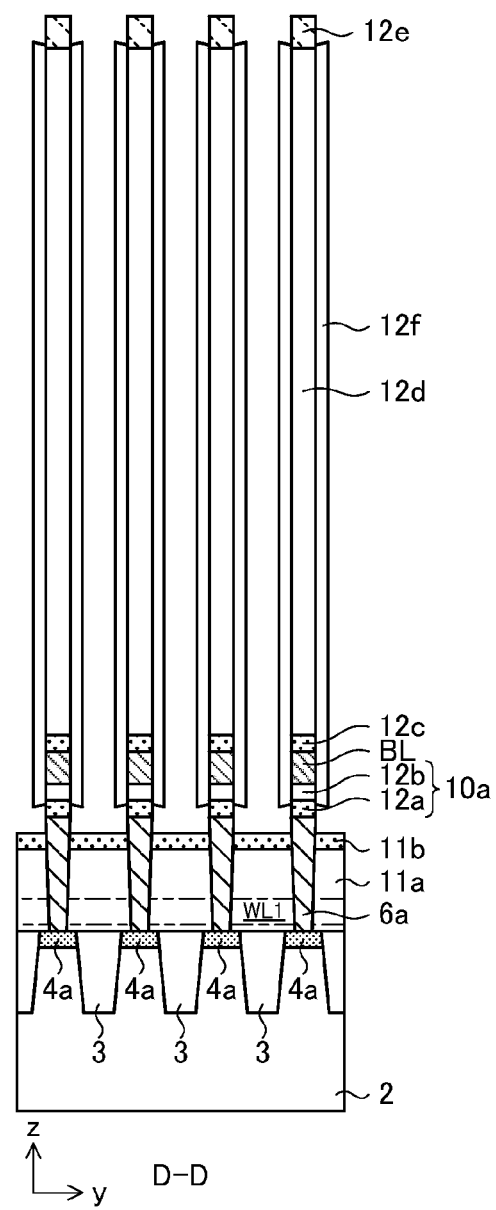
Figure 19A:
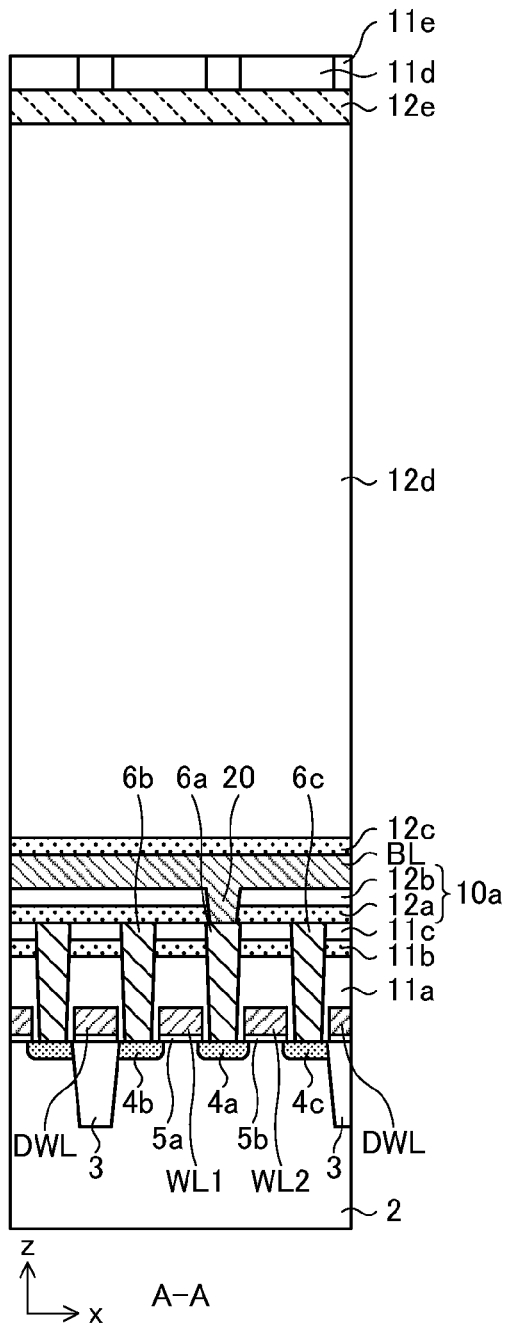
Figure 19B:
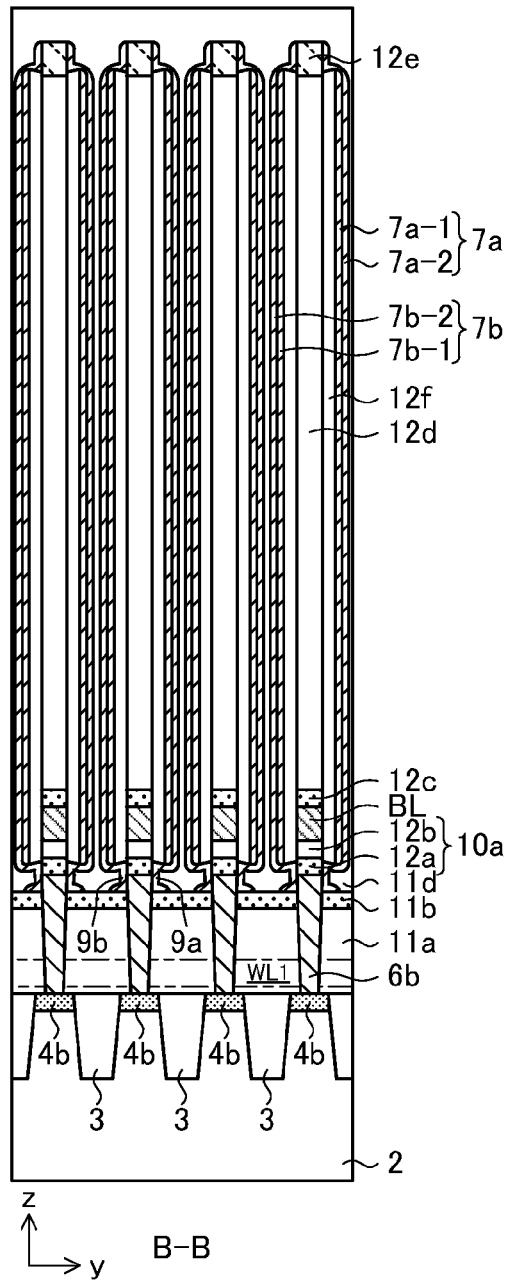
Figure 20A:
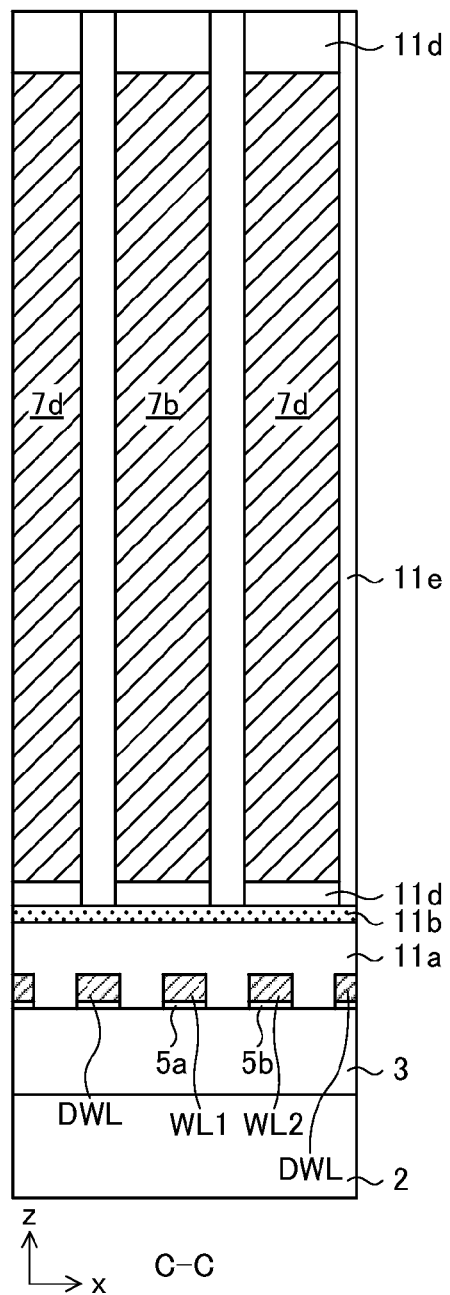
Figure 20B:
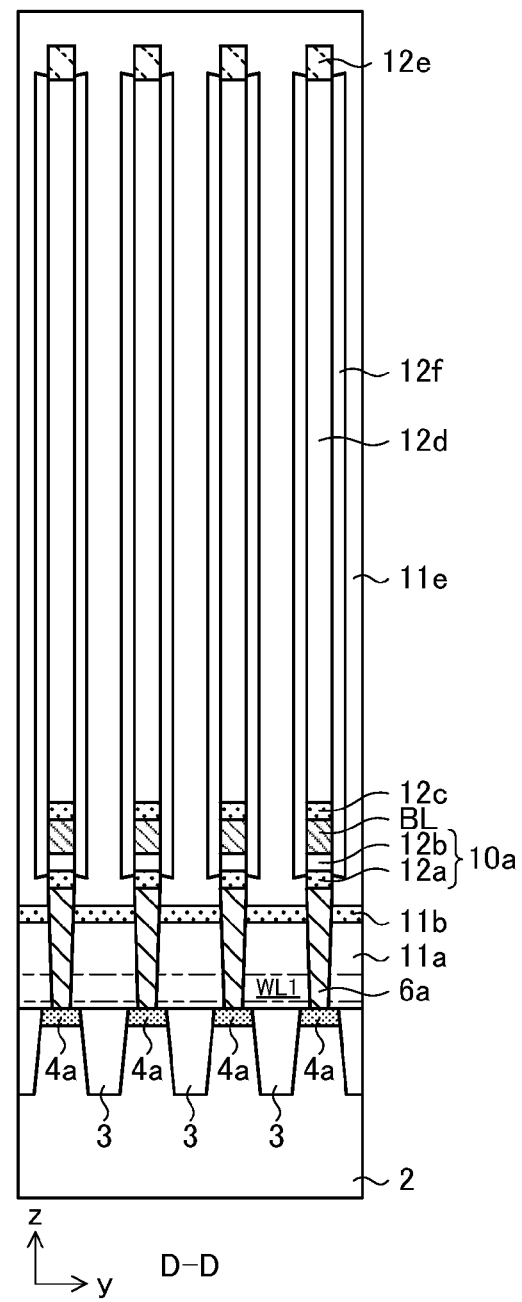

Next, as shown in FIGS. 13A to 14B, a fourth interlayer insulation layer 11d made of a silicon oxide film is deposited on the surface of the substrate 2 up to a height above the top surfaces of the fifth insulating material 12e. As shown in FIGS. 13B and 14B, the fourth interlayer insulation layer 11d fills the areas between the bit lines BL. Then, the fourth interlayer insulation layer 11d is patterned by photolithography. The patterning is performed in order to remove unnecessary portions of the lower electrodes and the contact conductors 9 and thereby separate the lower electrodes and the contact conductors 9 in the x direction. As shown in FIGS. 15A to 16B, the fourth interlayer insulation layer 11d is thereby processed into strips that are long in the y direction so that the unnecessary portions of the lower electrodes and the contact conductors 9 are exposed. The patterning is performed by highly selective etching. Here, the second interlayer insulation layer 11b made of a silicon nitride film is used as an etching stopper.

As shown in FIGS. 17A to 18B, the exposed third conductive material 7-2 is removed by anisotropic etching. The second conductive material 7-1 that is exposed by the removal of the third conductive material 7-2 is also removed in a similar way. By the steps so far, the first to fourth lower electrodes 7a to 7d and the first to fourth contact conductors 9a to 9d shown in FIGS. 1 and 2 are completed.

According to the present manufacturing method, forming the lower electrodes 7a to 7d as described above provides improved area efficiency inside memory cells. More specifically, plate-like conductors are typically formed by patterning, which inevitably produces rounded corners. According to the present manufacturing method, the deposition of the second and third conductive materials 7-1 and 7-2 as sidewalls prevents the production of rounded corners. The lower electrodes 7a to 7d therefore need not be made greater than necessary, which contributes to improved area efficiency inside memory cells.

Next, as shown in FIGS. 19A to 20B, a fifth interlayer insulation layer 11e made of a silicon oxide film is deposited on the surface of the substrate 2. The surface of the fifth interlayer insulation layer 11e is flattened by chemical mechanical polishing (CMP).

Figure 21A:
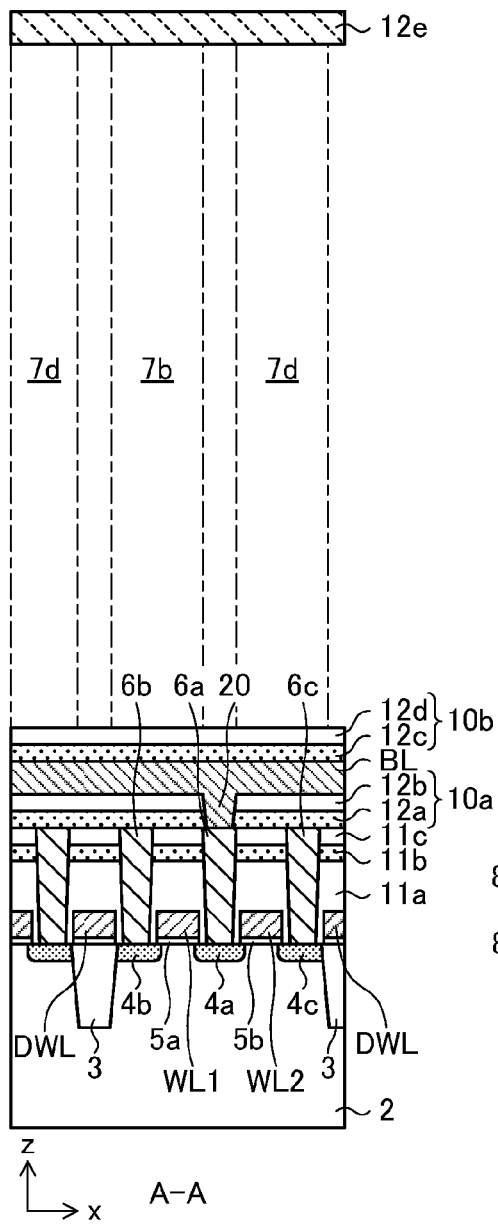
Figure 21B:
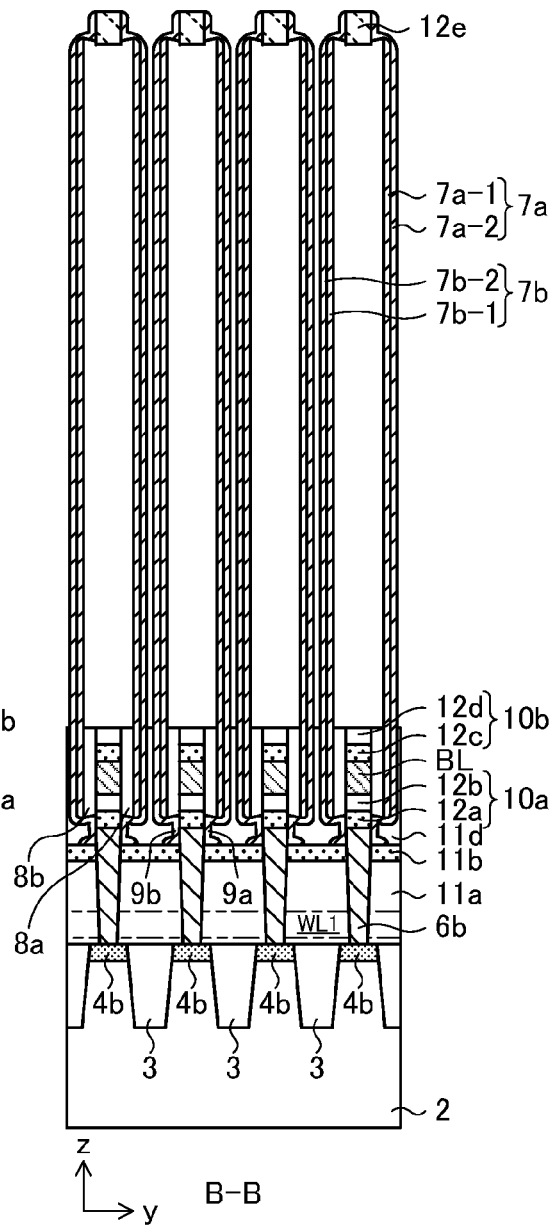
Figure 22A:
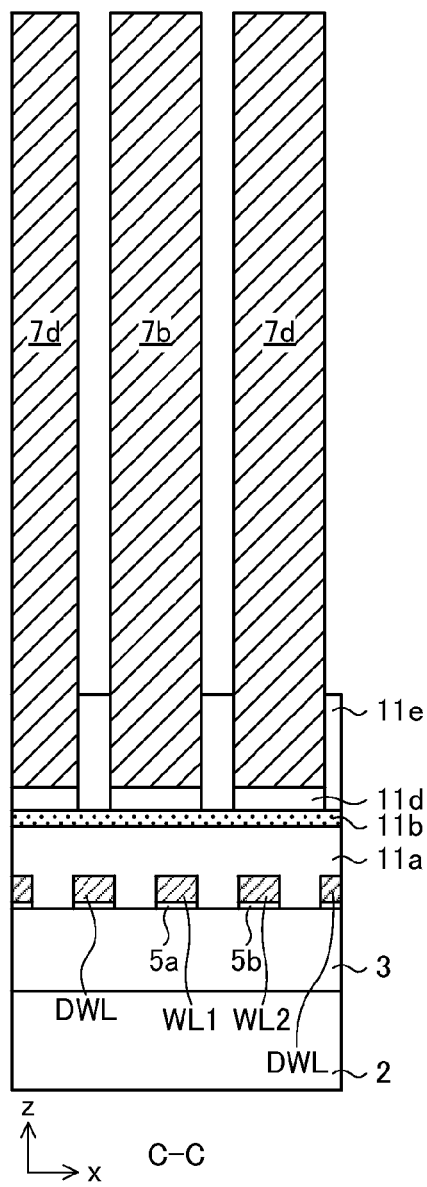
Figure 22B:
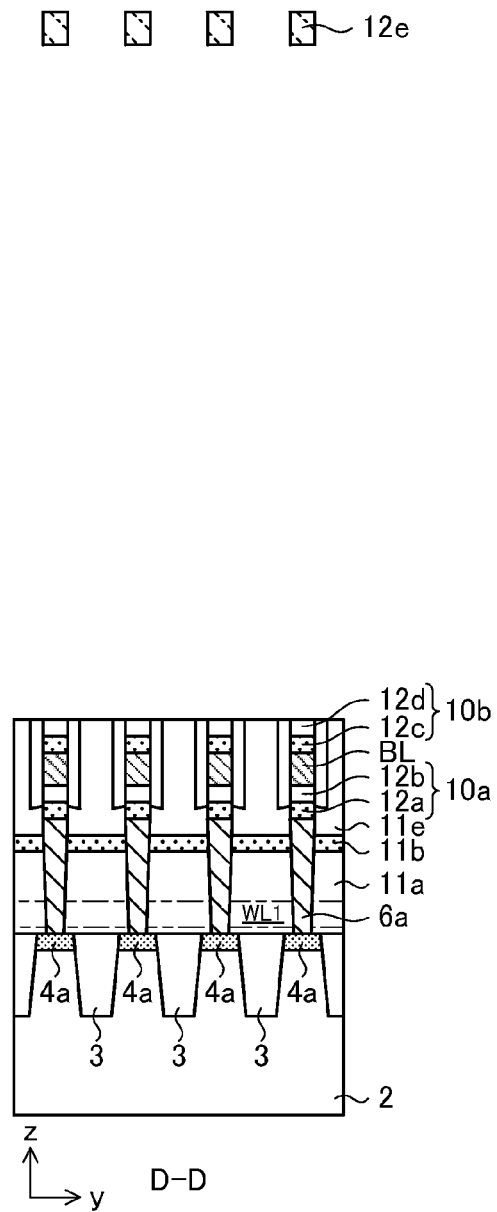

Hydrofluoric acid-based wet etching is performed to etch silicon oxide films. As shown in FIGS. 21A and 21B, the etching removes the fourth and sixth insulating materials 12d and 12f which have been remaining between the lower electrodes that are opposed to each other across the bit lines BL. As shown in FIGS. 22A and 22B, the fifth interlayer insulation layer 11e is also removed. It should be noted that, as shown in FIGS. 21A to 22B, such silicon oxide films are not completely removed. The etching is stopped at a position slightly above the top surface of the third insulating material 12c. The reason is to prevent the bit lines BL and the first to third contact plugs 6a to 6c from constituting a capacitor with a top electrode 22 which will be formed in a subsequent step. By the steps so far, the third and fourth insulating materials 12c and 12d are made into the first insulation layer 10b described above.

Figure 23A:
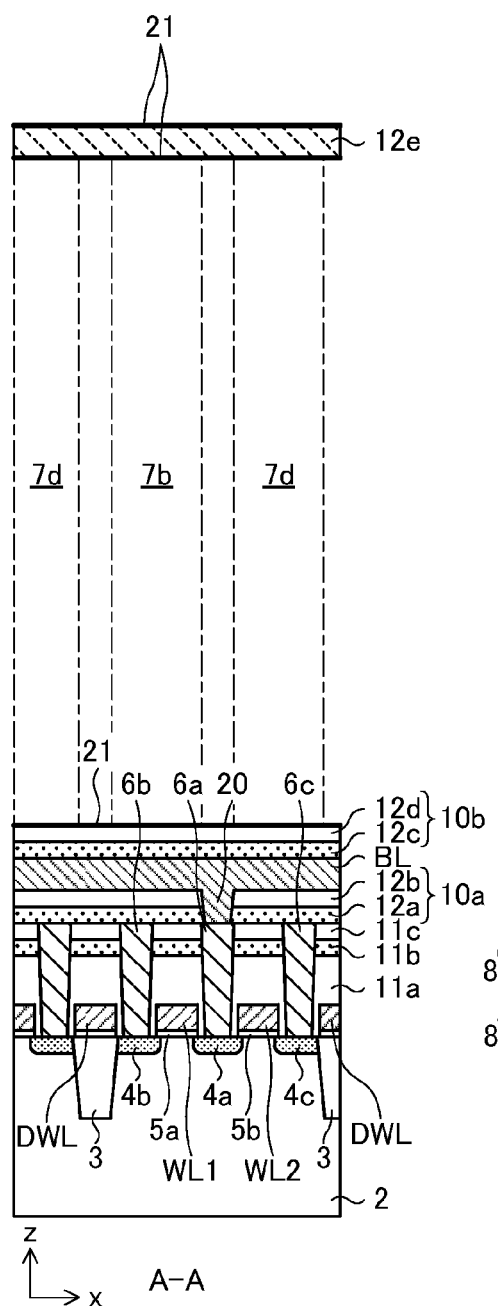
Figure 23B:
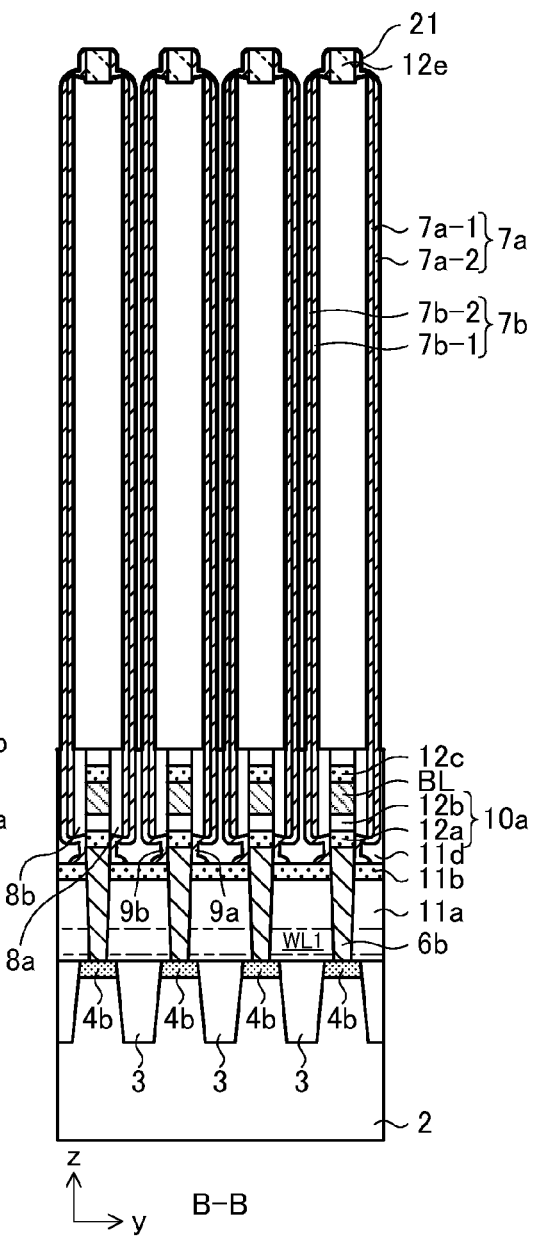

Next, as shown in FIGS. 23A and 23B, a thin silicon oxide film (5 nm or so) is formed as a capacitor insulation film 21 on the exposed surfaces of the first to fourth lower electrodes 7a to 7d. The capacitor insulation film 21 is also formed on the exposed surfaces of the fifth insulating material 12e which is left to support the first to fourth lower electrodes 7a to 7d, and on the surfaces of the silicon oxide films exposed between the lower electrodes.

Finally, as shown in FIGS. 3A and 3B, a top electrode 22 is formed over the entire surface of the substrate 2 so as to be opposed to the first to fourth lower electrodes 7a to 7d via the capacitor insulation film 21. By the steps so far, the semiconductor device 1 is completed.

As has been described above, according to the method of manufacturing a semiconductor device of the present embodiment, it is possible to manufacture a semiconductor device 1 that includes bit lines BL of straight shape, and wherein the longitudinal direction of cell transistors (x direction) is parallel to the direction of extension of the bit lines BL, and the bit lines BL are laid in positions overlapping the cell transistors when seen in a plan view.

It is apparent that the present invention is not limited to the above embodiments, but may be modified and changed without departing from the scope and spirit of the invention.

For example, while the foregoing embodiment has disclosed the case where the present invention is applied to a DRAM of so-called 6F² type, the present invention is suitably applicable to DRAMs of other types.

In addition, while not specifically claimed in the claim section, the applicant reserves the right to include in the claim section of the application at any appropriate time the following methods:

A1. A method of manufacturing a semiconductor device, comprising:

forming first and second electrodes to be controlled on a surface of a substrate;

forming first to third interlayer insulation layers on the surface of the substrate in succession;

forming first and second contact plugs through the first to third interlayer insulation layers, bottom surfaces of the first and second contact plugs being in contact with the first and second electrodes to be controlled, respectively;

depositing a first insulating material and a second insulating material on a top surface of the third interlayer insulation layer in succession;

forming a bit line contact plug through the first and second insulating materials, a bottom surface of the bit line contact plug being electrically connected to the first contact plug;

depositing a first conductive material on a top surface of the second insulating material, the first conductive material being electrically connected to the bit line contact plug;

depositing a third insulating material, a fourth insulating material, and a fifth insulating material on a top surface of the first conductive material in succession;

etching the fifth insulating material, the fourth insulating material, the third insulating material, the first conductive material, the second insulating material, and the first insulating material in succession based on a bit line pattern;

depositing a sixth insulating material covering side surfaces of the first to fifth insulating materials and the first conductive material, a top surface of the fifth insulating material, and an exposed surface of the third interlayer insulation layer;

covering a surface of the sixth insulating material with a second conductive material;

etching back the second conductive material, the sixth insulating material, and the third interlayer insulation layer in succession;

etching the sixth insulating material and the third interlayer insulation layer by isotropic wet etching, thereby exposing a side surface of the second contact plug;

depositing a third conductive material being electrically connected to both a surface of the second conductive material and an exposed surface of the second contact plug, thereby forming a lower electrode being constituted by the second and third conductive materials;

removing at least a part of the fourth insulating material and at least apart of the sixth insulating material, and forming a capacitor insulation film on an exposed surface of the lower electrode; and forming a top electrode being opposed to the lower electrode via the capacitor insulation film.

A2. The method of manufacturing a semiconductor device as described in A1, wherein:

the first and third interlayer insulation layers and the second and fourth insulating materials are made of a silicon oxide film; and the second interlayer insulation layer and the first, third, and fifth insulating materials are made of a silicon nitride film.

A3. The method of manufacturing a semiconductor device as described in A2, wherein the first insulating material has a thickness greater than that of a portion of the sixth insulating material formed on a horizontal plane.

A4. The method of manufacturing a semiconductor device as described in A1, wherein forming the lower electrode includes:

forming a fourth interlayer insulation layer up to a height above the top surface of the fifth insulating material after formation of the third conductive material;

patterning the fourth interlayer insulation layer to expose the third conductive material; and etching the second and third conductive materials by anisotropic etching.

A5. The method of manufacturing a semiconductor device as described in A1, comprising:

forming a gate insulation film covering areas of the surface of the substrate between the first electrode to be controlled and the second electrode to be controlled; and forming a word line covering a top surface of the gate insulation film.

What is claimed is:

1. A semiconductor device comprising:
   a substrate;
   first and second electrodes formed on the substrate arranged in a first direction, the first and second electrodes being included in a first cell transistor;
   a first contact plug having bottom and top surfaces, the bottom surface thereof being in contact with the first electrode;
   a second contact plug having bottom, first side and top surfaces, the bottom surface thereof being in contact with the second electrode;
   a first insulation film formed on the top surfaces of the first and second contact plugs;
   a bit line formed on the first insulation film, the bit line extending in the first direction;
   a bit line contact plug formed through the first insulation film so as to connect the bit line and the top surface of the first contact plug;
   a first cell capacitor including a first lower electrode, the first lower electrode and the bit line being arranged in a second direction different from the first direction;
   a second insulation film arranged between the bit line and the first lower electrode so as to insulate from each other; and
   a first contact conductor connecting the first lower electrode to the first side surface of the second contact plug.

2. The semiconductor device as claimed in claim 1, wherein
   the second contact plug further has a second side surface,
   the first cell capacitor further includes a second lower electrode, the bit line being arranged between the first and second lower electrodes in the second direction, and
   the semiconductor device further comprises:
      a third insulation film arranged between the bit line and the second lower electrode so as to insulate from each other; and
      a second contact conductor connecting the second lower electrode to the second side surface of the second contact plug.

3. The semiconductor device as claimed in claim 2, wherein
   each of the first and second lower electrodes has a plate-shaped,
   the first contact conductor has a bended shape to connect a bottom end of the first lower electrode to the first side surface of the second contact plug, and
   the second contact conductor has a bended shape to connect a bottom end of the second lower electrode to the second side surface of the second contact plug.

4. The semiconductor device as claimed in claim 2, wherein
   the first cell capacitor further includes:
      an upper electrode covering the first and second lower electrodes; and
      a capacitor insulation film provided between the first and second lower electrodes and the upper electrode, and
   the semiconductor device further comprises a fourth insulation film formed on the bit line so as to insulate the bit line from the upper electrode.

5. The semiconductor device as claimed in claim 1, further comprising:
   a first word line arranged between the first and second contact plugs and extending in the second direction; and
   a first gate insulation film arranged between the first word line and the substrate.

6. The semiconductor device as claimed in claim 2, further comprising:
   a third electrode formed on the substrate, the first to third electrodes being arranged in the first direction so that the first electrode is arranged between the second and third electrodes, the first and third electrodes being included in a second cell transistor;
   a third contact plug having bottom, first side, second side and top surfaces, the bottom surface thereof being in contact with the third electrode;
   a second cell capacitor including third and fourth lower electrodes, the bit line being arranged between the third and fourth lower electrodes in the second direction;
   a fifth insulation film arranged between the bit line and the third lower electrode so as to insulate from each other;
   a sixth insulation film arranged between the bit line and the fourth lower electrode so as to insulate from each other;
   a third contact conductor connecting the third lower electrode to the first side surface of the third contact plug; and
   a fourth contact conductor connecting the fourth lower electrode to the second side surface of the third contact plug.

7. The semiconductor device as claimed in claim 6, wherein
   each of the first to fourth lower electrodes has a plate-shaped,
   the first contact conductor has a bended shape to connect a bottom end of the first lower electrode to the first side surface of the second contact plug,
   the second contact conductor has a bended shape to connect a bottom end of the second lower electrode to the second side surface of the second contact plug,
   the third contact conductor has a bended shape to connect a bottom end of the third lower electrode to the first side surface of the third contact plug, and
   the fourth contact conductor has a bended shape to connect a bottom end of the fourth lower electrode to the second side surface of the third contact plug.

8. The semiconductor device as claimed in claim 6, further comprising:
   an upper electrode covering the first to fourth lower electrodes;
   a capacitor insulation film provided between the first to fourth lower electrodes and the upper electrode; and
   a fourth insulation film formed on the bit line so as to insulate the bit line from the upper electrode.

9. The semiconductor device as claimed in claim 6, comprising:
   a first word line arranged between the first and second contact plugs and extending in the second direction;
   a first gate insulation film arranged between the first word line and the substrate;
   a second word line arranged between the first and third contact plugs and extending in the second direction; and
   a second gate insulation film arranged between the second word line and the substrate.

* * * * *